United States Patent

Okamura et al.

[11] Patent Number: 5,400,000
[45] Date of Patent: Mar. 21, 1995

[54] BAND-PASS FILTER HAVING TWO LOOP-SHAPED ELECTRODES

[75] Inventors: Hisatake Okamura; Masahiro Kasahara; Kenji Ajioka; Tetsuo Taniguchi, all of Nagaokakyo, Japan

[73] Assignee: Murata Manufacturing Co., Ltd., Kyoto, Japan

[21] Appl. No.: 112,652

[22] Filed: Aug. 26, 1993

Related U.S. Application Data

[63] Continuation of Ser. No. 832,357, Feb. 7, 1992, abandoned.

[30] Foreign Application Priority Data

| Feb. 15, 1991 | [JP] | Japan | 3-021875 |
| Jun. 11, 1991 | [JP] | Japan | 3-138838 |
| Jan. 10, 1992 | [JP] | Japan | 4-021749 |
| Jan. 10, 1992 | [JP] | Japan | 4-021750 |

[51] Int. Cl.$^6$ .............................................. H03H 7/00
[52] U.S. Cl. ................................... 333/175; 333/185; 333/202
[58] Field of Search ............... 333/167, 177, 184, 185, 333/175, 219, 204, 202

[56] References Cited

U.S. PATENT DOCUMENTS

| 4,894,629 | 1/1990 | Okamura et al. | 333/177 |
| 5,075,650 | 12/1991 | Okamura et al. | 333/185 X |

FOREIGN PATENT DOCUMENTS

| 0014501 | 1/1988 | Japan | 333/204 |
| 0171012 | 7/1988 | Japan | 333/178 |
| 0071710 | 3/1991 | Japan | 333/185 |

Primary Examiner—Seungsook Ham
Attorney, Agent, or Firm—Ostrolenk, Faber, Gerb & Soffen

[57] ABSTRACT

Two coil electrode patterns are formed on one surface of a plate containing a dielectric material. These coil electrode patterns are formed in a loop shape, and disposed in a magnetically connected state with each other. Input/output terminal patterns and earth terminal patterns are drawn out from the coil electrode patterns toward edges on different sides of the plate. The input/output terminal pattern and the earth terminal pattern of one coil electrode pattern are disposed at a selected distance from each other so as to provide a predetermined impedance. An earth electrode pattern is formed opposite the coil electrode patterns with the plate between them. Earth terminal patterns are connected to the earth electrode pattern. The earth terminal patterns of the earth electrode pattern are connected to the earth terminal patterns of the coil electrode patterns. A trimming electrode may be formed for adjusting the passing band frequency of the band-pass filter optionally.

16 Claims, 32 Drawing Sheets

F I G. 12
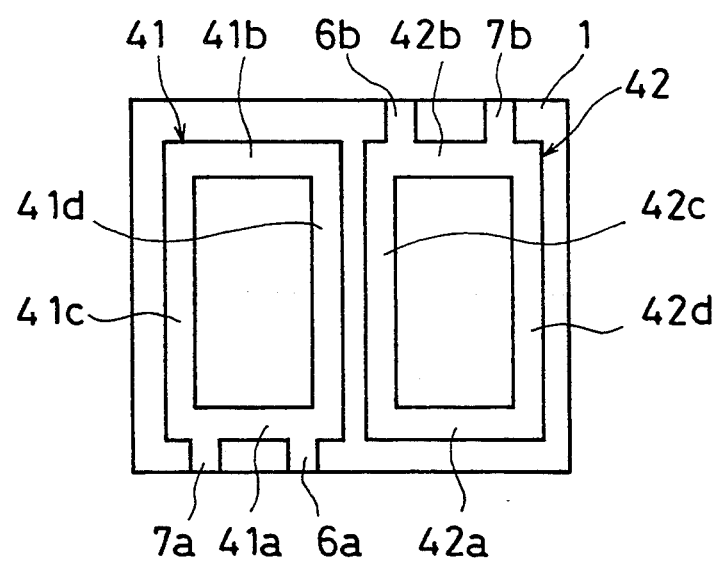

F I G. 13
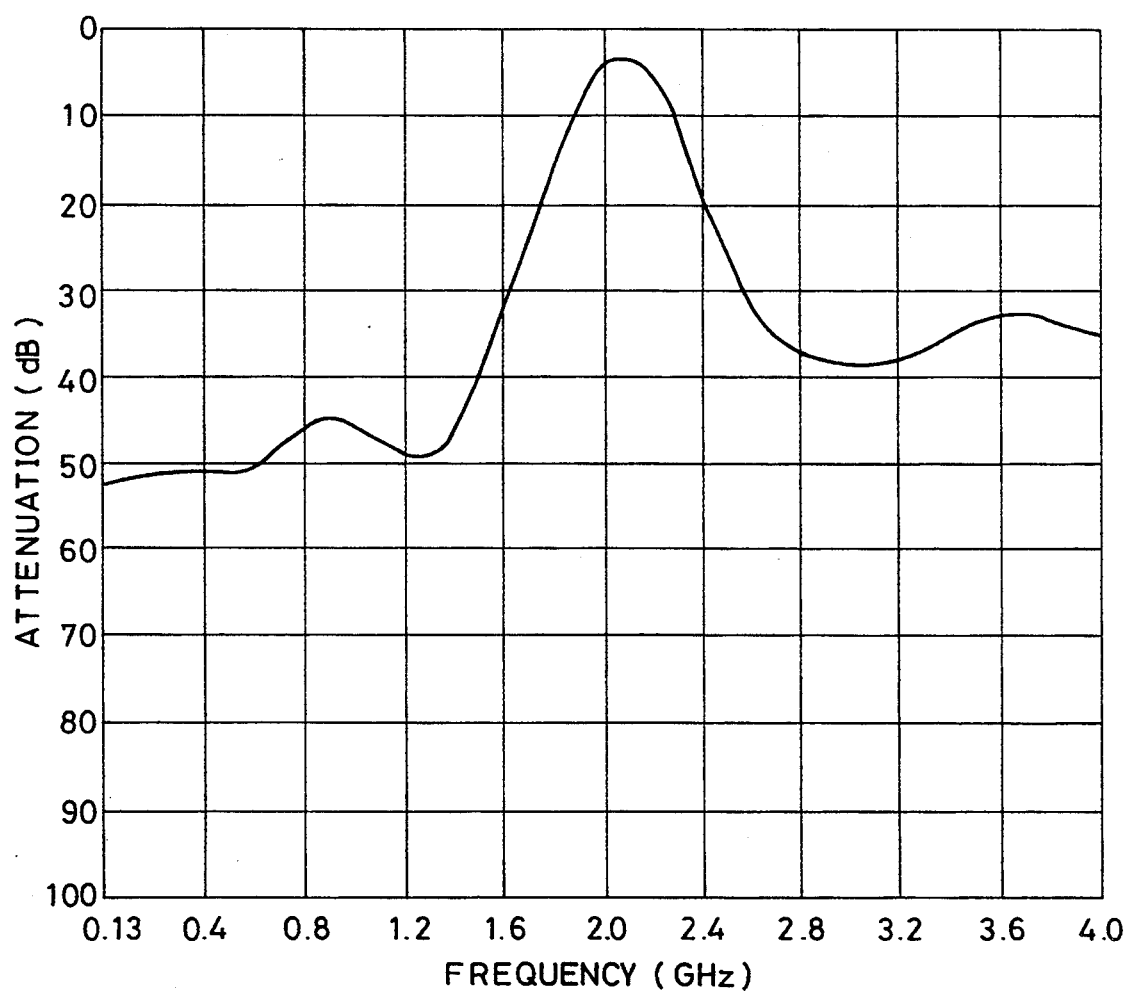

F I G. 14
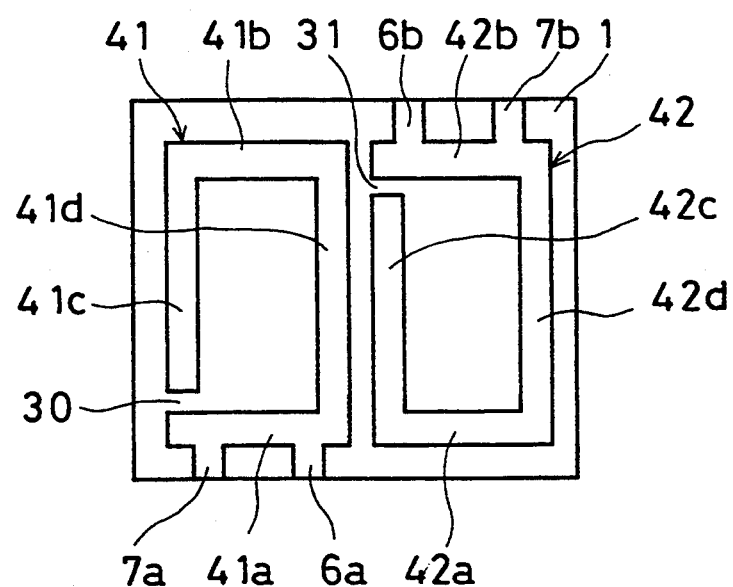

F I G.16
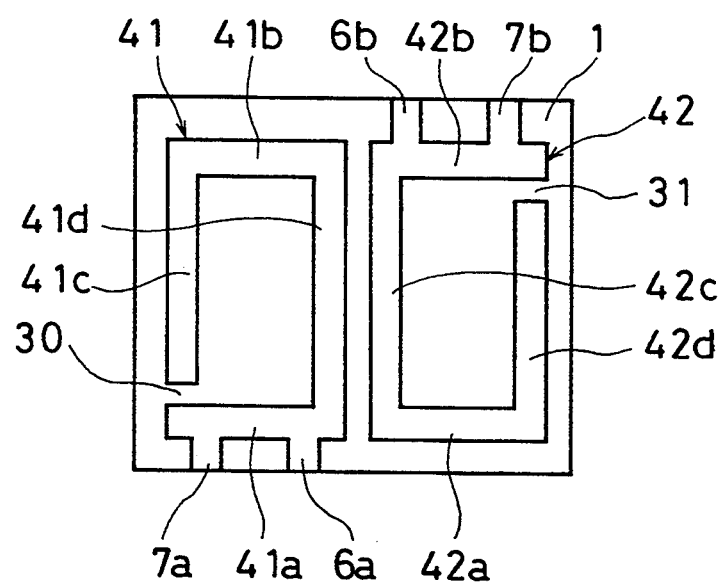

F I G.17
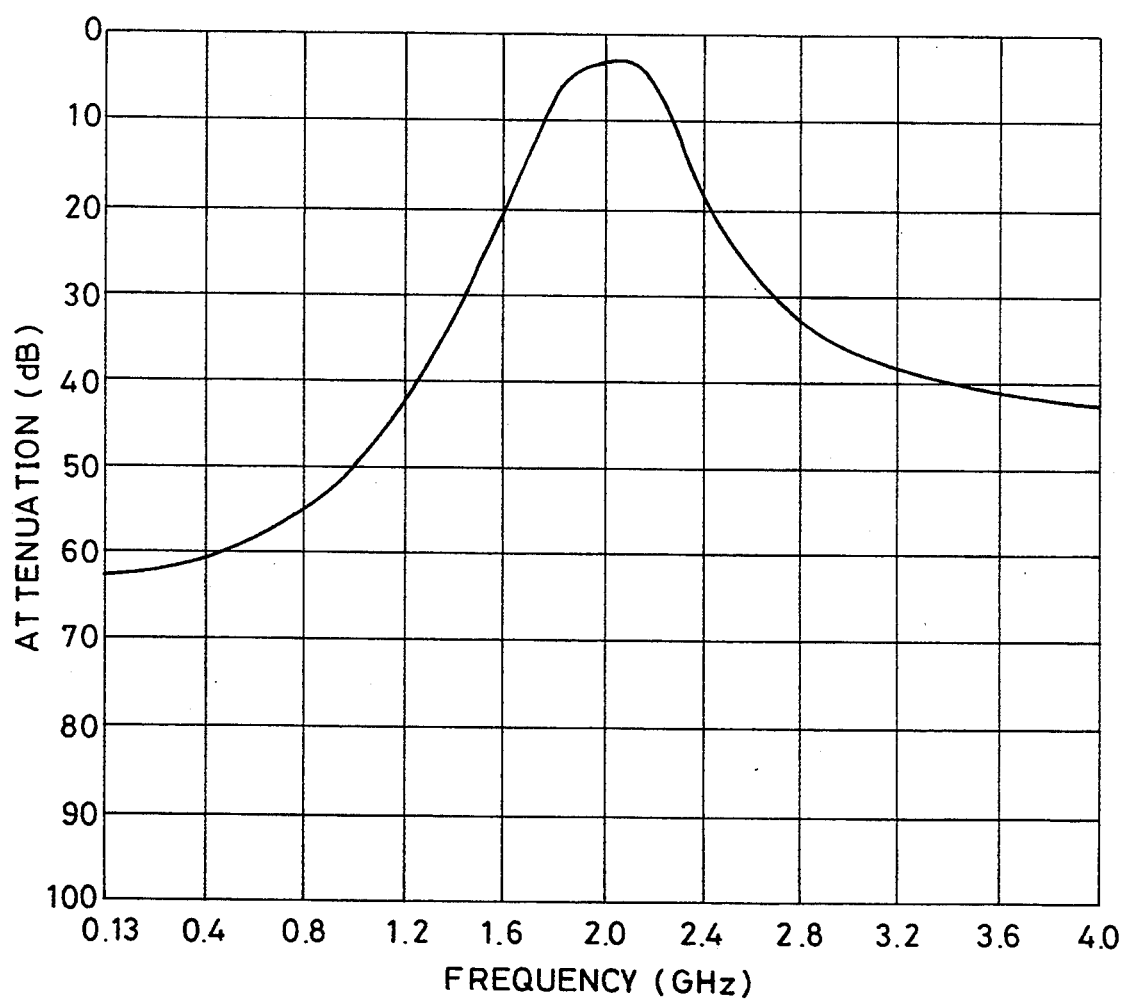

F I G. 19
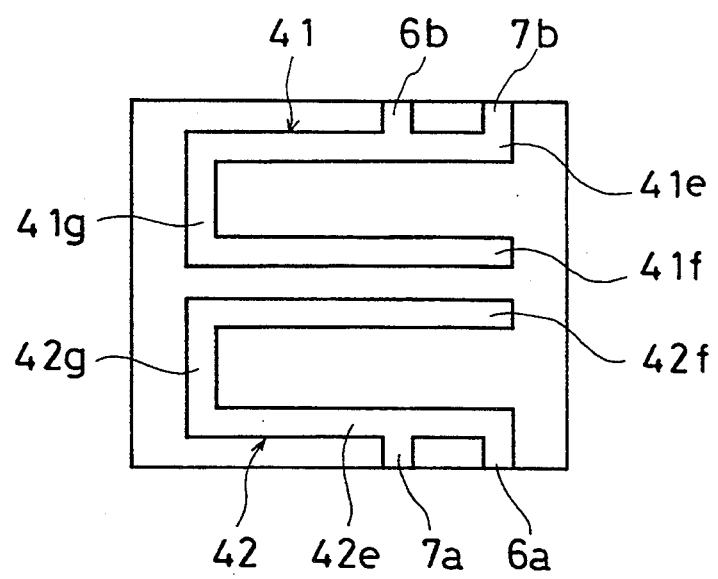

F I G. 21
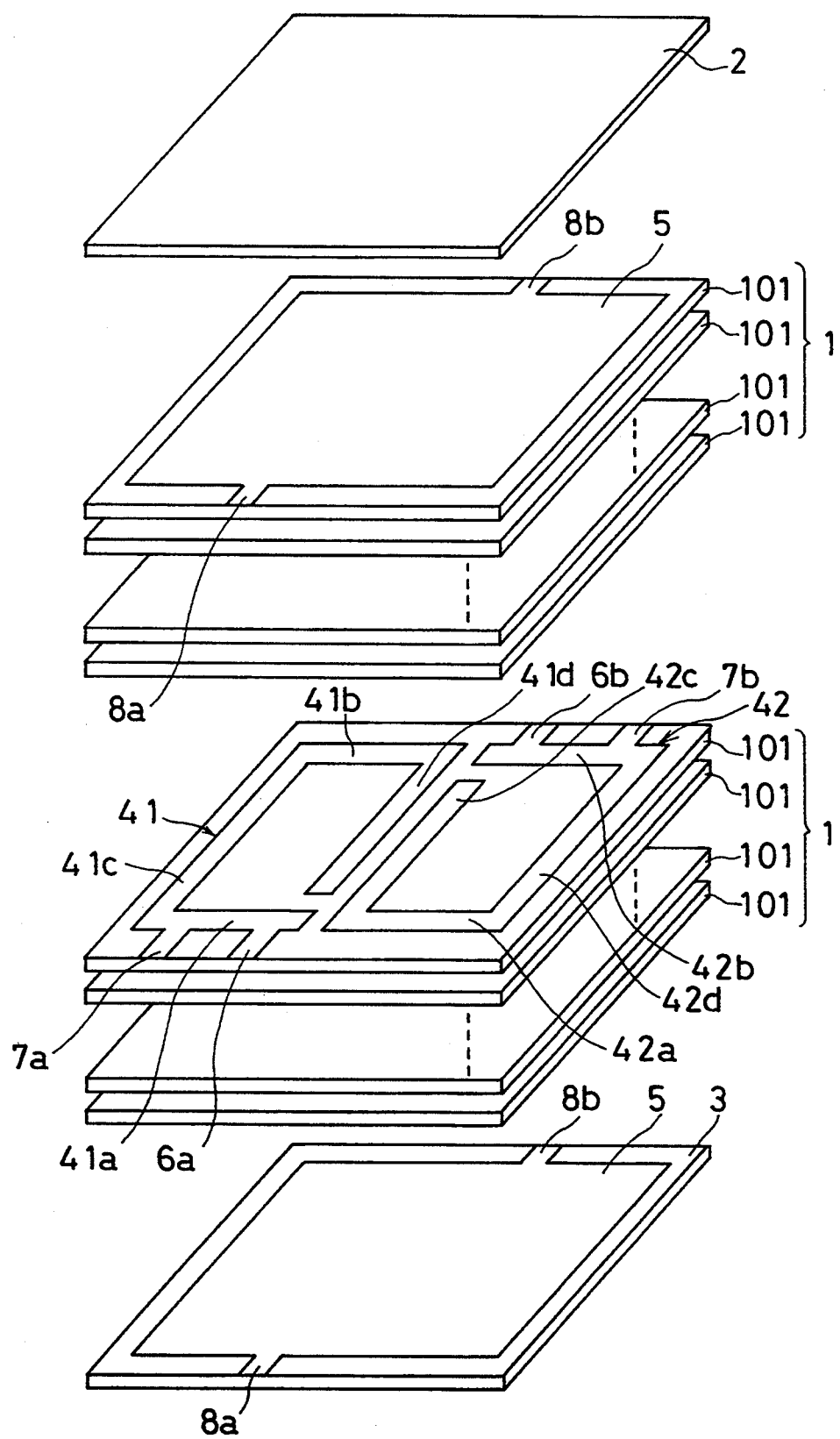

F I G. 24
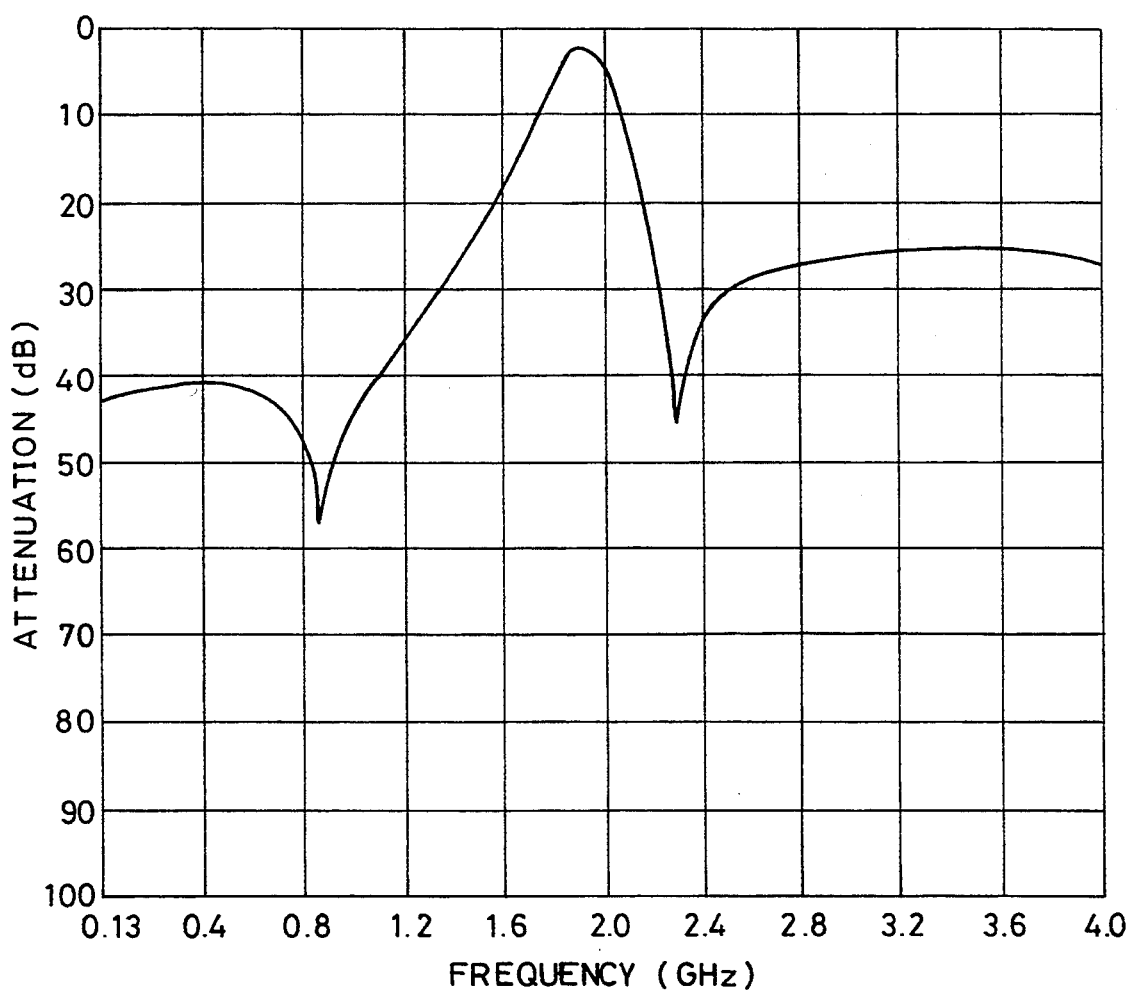

F I G. 26
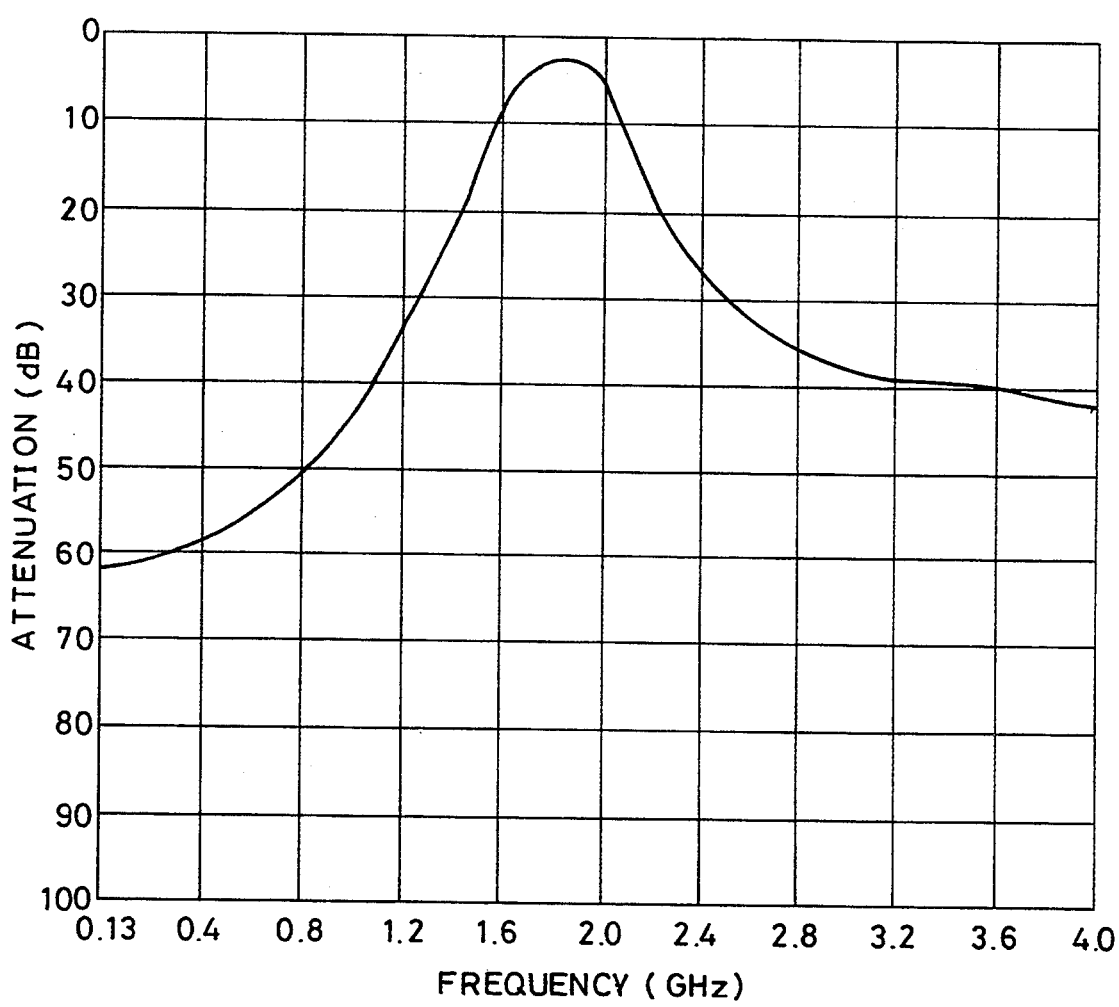

BAND-PASS FILTER HAVING TWO LOOP-SHAPED ELECTRODES

This is a Continuation of application Ser. No. 07/832,357, filed on Feb. 7, 1992, (abandoned).

BACKGROUND OF THE INVENTION

1. Field of the Invention

The present invention relates to a dielectric-laminate type band-pass filter for use in a portable radio or the like in the frequency range of several hundred MHz to several GHz.

2. Description of the Prior Art

Conventional resonators are divided roughly into the resonator using a strip line and the resonator using a coil pattern. A band-pass filter is constructed using such resonators, by connecting plural resonators magnetically.

A resonator using the strip line, includes a resonator of ½ wavelength whose line is open at both ends as shown in FIG. 36, and a resonator of ¼ wavelength whose line is open at one end and shortcircuited at the other end as shown in FIG. 37.

A resonator using the coil pattern, as shown in FIG. 38, includes one in which a spiral-shaped coil pattern 201 and an earth pattern 203 are formed on both sides of a dielectric layer 202 which is clamped therebetween.

In the band-pass filter using the above-mentioned conventional resonator, however, such problems as shown hereinafter were encountered respectively.

[1] band-pass filter using the strip line (a) A resonator having the resonance frequency of 2 to 3 GHz becomes substantially large. In particular, a band-pass filter having a construction in which plural resonators are connected, becomes considerably large. This is due to the following reasons.

That is, lengths $L_{10}$, $L_{11}$ of the strip line are determined as shown in Equation 1 (resonator of ½ wavelength) and Equation 2 (resonator of ¼ wavelength).

Equation 1

$$L_{10} = \frac{1}{2} \lambda \times \frac{1}{\sqrt{\epsilon}}$$

Equation 2

$$L_{11} = \frac{1}{4} \lambda \times \frac{1}{\sqrt{\epsilon}}$$

Where, $\lambda$; wavelength, $\epsilon$; dielectric constant of dielectric-laminate sheet.

At present, a dielectric constant of a dielectric-laminate sheet which is capable of being co-fired with silver or copper and has a good temperature characteristic can not be made so large, about $\epsilon \approx 10$. Thus, in the above Equations 1 and 2, when $\epsilon = 10$, the dimensions $L_{10} = 15.8$ mm and $L_{11} = 7.9$ mm, which are very long, thus resulting in a large resonator (band-pass filter) as stated above.

(b) In the band-pass filter, it is desirable to adjust input/output impedances depending on the apparatus into which it is incorporated (the adjustment involves matching of impedances of the band-pass filter and the apparatus). However, in case of the strip-line type, since input/output impedances have specific values for every strip line, it is impossible to adjust the matching even by changing the take-out position from the strip line.

[2] band-pass filter using the coil-pattern

Since the coil pattern has a spiral shape, magnetic fluxes influence one another between the adjoining patterns, thus an electric current flow is difficult to obtain. Therefore, a substantial resistance increases and the Q value becomes lower.

For example, in FIG. 38, since the electric current flows in a same direction (both in the direction D in FIG. 38) in a pattern piece 201a and a pattern piece 201b, magnetic fields cancel each other to cause the magnetic flux to become coarse, and consequently an electric current flow is disturbed and the substantial resistance increases.

A further problem is that an insertion loss of the band-pass filter becomes larger to the extent the Q value is reduced.

The passing band frequency of the band-pass filter depends on the resonance frequencies of the resonators. The resonance frequencies of the resonators are decided by the dimensions of strip lines or coil-patterns, so once these patterns are formed, the resonance frequencies can not be adjusted. Therefore, when the dimensions of the patterns are in error, the passing band frequency of the band-pass filter is shifted from a predetermined desired value, resulting in an inferior device.

SUMMARY OF THE INVENTION

The present invention has been devised in view of such present circumstances, therefore, it is an object thereof to provide a band-pass filter which has a high Q and a low insertion loss, and moreover, which can be reduced in size and whose input/output impedances and passing band frequency can be adjusted optionally.

The present invention is directed to a band-pass filter comprising, two first electrodes formed in a loop shape and disposed in a magnetically connecting state with each other; a second electrode formed in a plane shape opposite the first electrodes with a plate comprising a dielectric material between the first electrodes and the second electrode; two earth terminals drawn out from the two first electrodes toward respective edges on opposite sides of the plate; two input/output terminals drawn out from the two first electrodes toward the end portions of the different side of the plate spaced a distance from the earth terminals so as to provided a predetermined impedance; and another pair of earth terminals drawn out from the second electrode toward said edges on said opposite sides of the plate.

In regard to the band-pass filter, a pair of second electrodes may be formed instead of only one second electrode, opposite both surfaces of the first electrodes with respective plates between the first electrodes and the pair of second electrodes.

In regard to the band-pass filter, at least one pair of the second electrodes may be divided into two, so as to have a substantially similar but somewhat larger shape than the first electrodes, and the other pair of earth terminals are drawn out respectively from the second electrodes which are divided into two toward said edges on said opposite sides of the plates.

In regard to the band-pass filter, between the first electrodes and at least one of the second electrodes, third electrodes having substantially same shape as the first electrodes may be formed.

In regard to the band-pass filter, trimming electrodes in a loop shape or a part of loop shape may be formed at a distance from and opposite the second electrode with a plate between the trimming electrodes and the second electrode, the trimming electrodes being connected to the first electrodes.

In regard to the band-pass filter, plural trimming electrodes may be formed in a band or strip shape within the second electrode, and connected to the second electrode.

When it is constructed as stated above, because it is a so-called strip-line construction in which the first electrodes and the second electrodes are positioned on opposite sides of a dielectric plate, and because pattern pieces of the first electrodes are not adjacent to each other as the spiral-shaped coil pattern, the Q value is improved remarkably and an insertion loss is reduced, improving the skirt response characteristics.

Moreover, since the first electrodes have a loop shape, the element size becomes smaller. In addition, since the impedance can be adjusted by just changing a distance between the input/output terminal and the earth terminal of the first electrodes, it is very simple to adjust the impedance.

The floating capacitance between the trimming electrodes and the second electrode is changed by trimming the trimming electrodes which are connected to the first electrodes, whereby the resonance frequency of each resonator is changed as well. The passing band frequency of the band-pass filter is changed with the advance of changing of resonance frequency.

The magnetic field shielding effect is changed by cutting the trimming electrodes formed within the second electrode. Hence, the magnetic field of each resonators is changed, whereby the resonating frequency is also changed. Thus, the passing band frequency of the band-pass filter is changed as well.

In these respects, the invention has an effect of providing a very excellent small-sized band-pass filter whose insertion loss is small and input/output impedances and passing band frequency can be adjusted optionally.

The above and further objects, features and advantages of the present invention will be more fully apparent from the following detailed description of the embodiments with accompanying drawings.

BRIEF DESCRIPTION OF THE DRAWINGS

FIG. 12 is a plan view of essential portions of a band-pass filter according to a second example of the present invention.

FIG. 13 is a graph showing frequency characteristics of the band-pass filter shown in FIG. 12.

FIG. 14 is a plan view of essential portions of a band-pass filter according to a third example of the present invention.

FIG. 16 is a plan view of essential portions of a band-pass filter according to a fourth example of the present invention.

FIG. 17 is a graph showing frequency characteristics of the band-pass filter shown in FIG. 16.

FIG. 19 is a plan view of essential portions of the band-pass filter according to the fifth example of the present invention.

FIG. 21 is an exploded perspective view of a band-pass filter according to a sixth example of the present invention.

FIG. 24 is a graph showing frequency characteristics of the band-pass filter shown in FIG. 23.

FIG. 26 is a graph showing frequency characteristics of the band-pass filter shown in FIG. 25.

DESCRIPTION OF THE PREFERRED EMBODIMENTS

(First Example)

Figure 1:
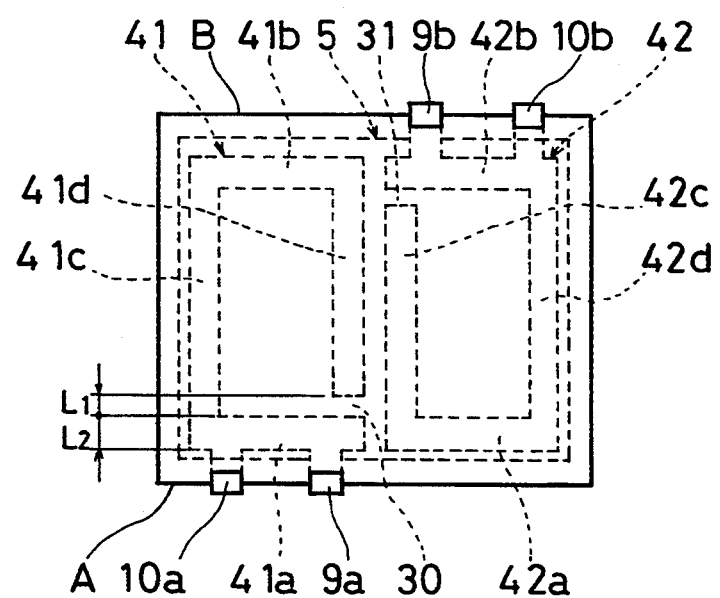
FIG. 1 is a plan view of a band-pass filter according to a first example of the present invention.
Figure 2:
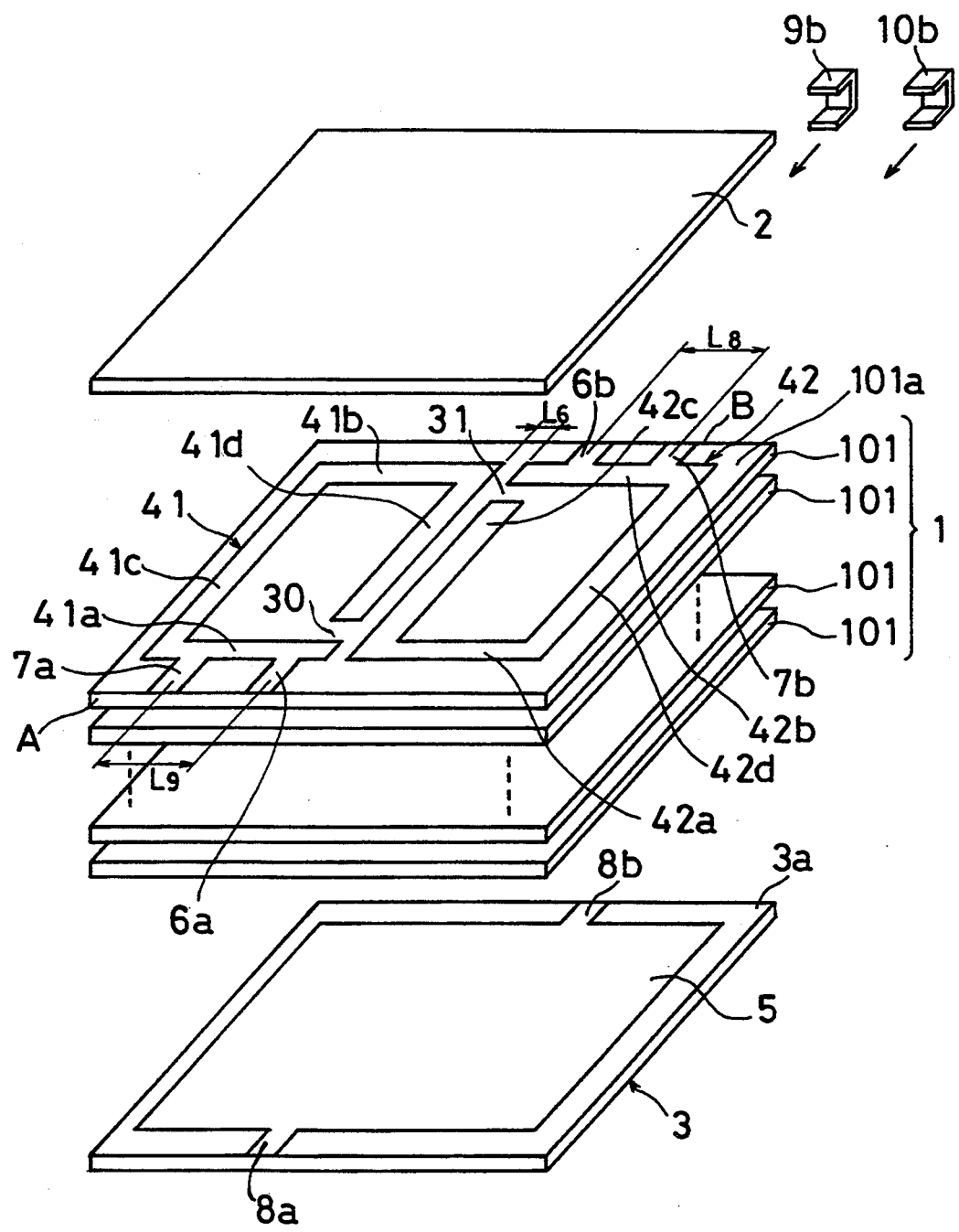
FIG. 2 is an exploded perspective view of the band-pass filter according to the first example of the present invention.
Figure 3:
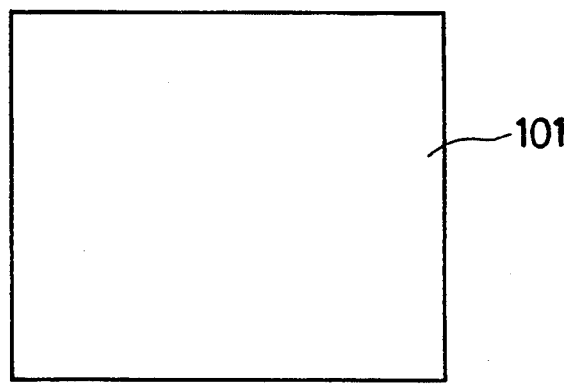
FIG. 3 is a plan view of a dielectric sheet used in the present invention.
Figure 4:
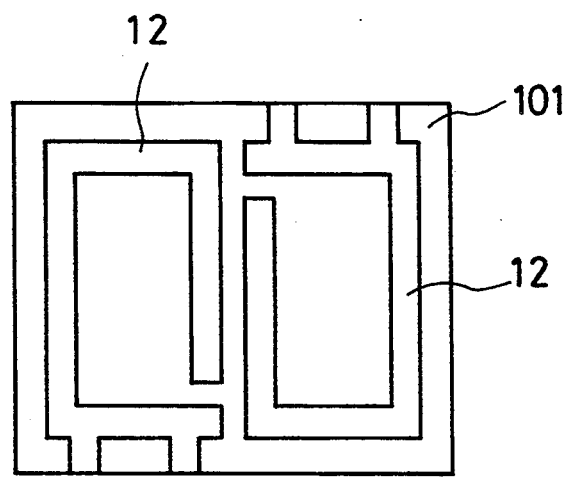
FIG. 4 is a plan view showing a state where coil electrode patterns are formed on the dielectric sheet of FIG. 3.
Figure 5:
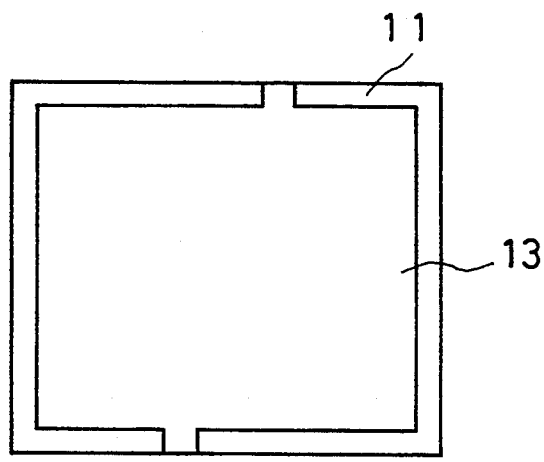
FIG. 5 is a plan view showing a state where an earth electrode pattern is formed on the dielectric sheet of FIG. 3.
Figure 6:
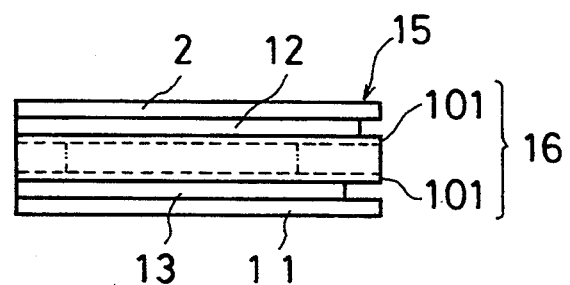
FIG. 6 is a front view when the dielectric sheets are laminated.
Figure 7:
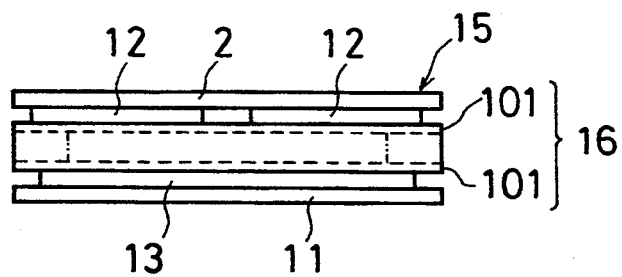
FIG. 7 is a side view when the dielectric sheets are laminated.
Figure 8:
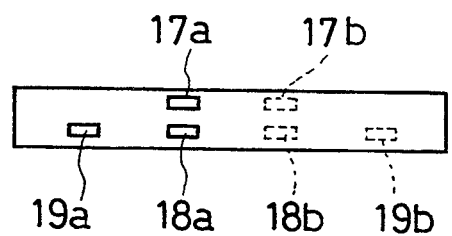
FIG. 8 is a front view when a laminate is pressed.
Figure 9:
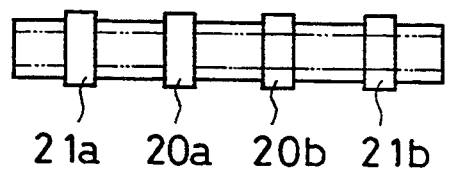
FIG. 9 is a front view when external electrodes are formed.
Figure 10:
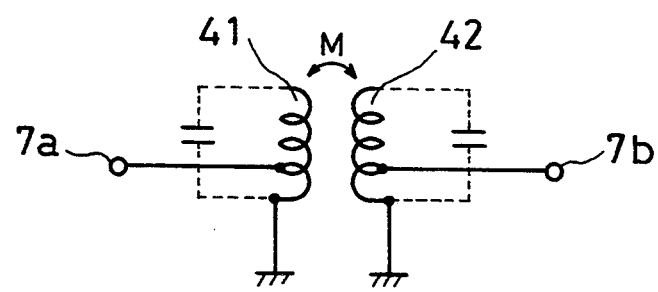
FIG. 10 is an equivalent circuit diagram of the band-pass filter shown in FIG. 1.
Figure 11:
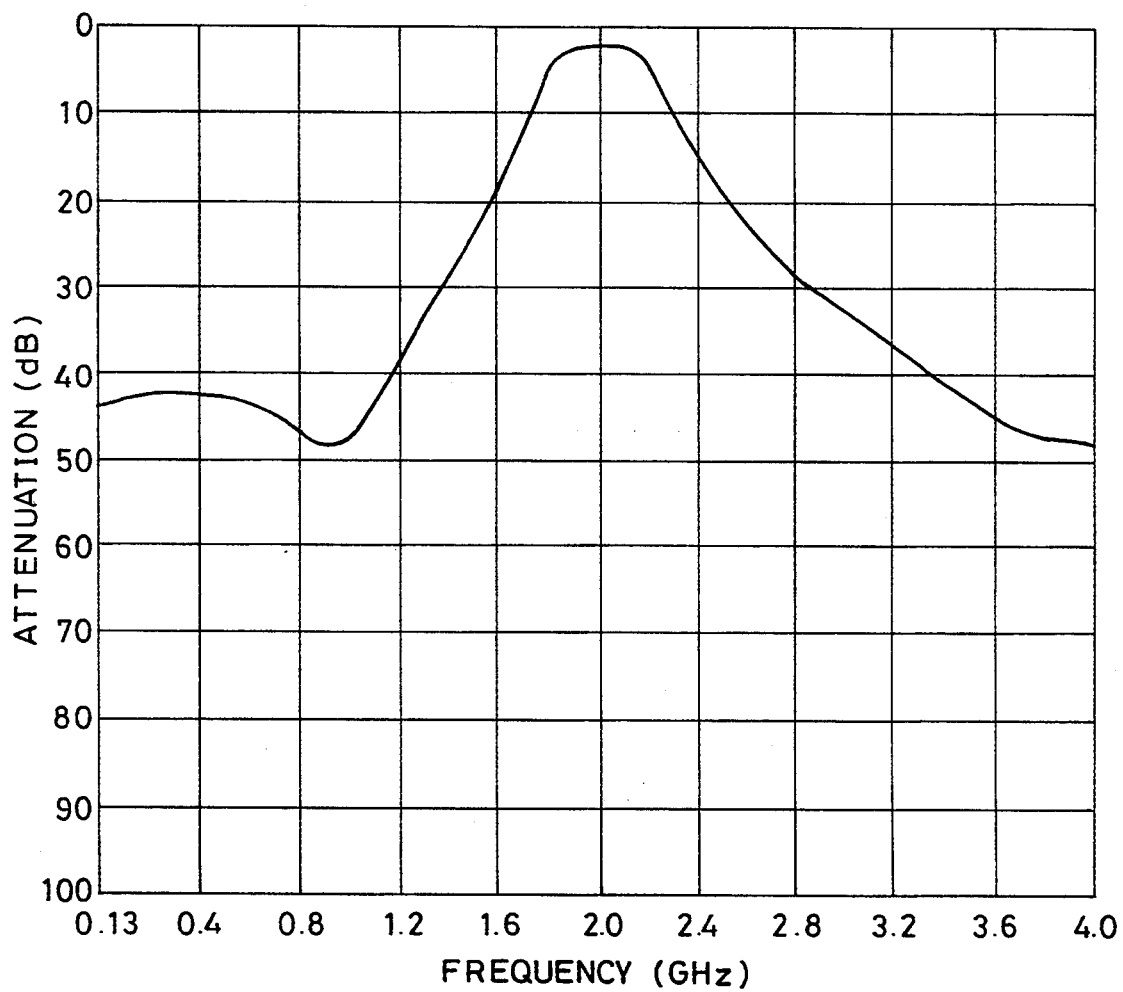
FIG. 11 is a graph showing frequency characteristics of the band pass filter shown in FIG. 1.

A first example of the present invention is described in the following with reference to FIG. 1 through FIG. 11. FIG. 1 and FIG. 2 are views showing a construction of a band-pass filter according to the first example of the present invention, wherein FIG. 1 is a plan view and FIG. 2 is an exploded perspective view, FIG. 3 is a plan view of a dielectric sheet used in the present invention, FIG. 4 is a plan view showing a state where coil electrode patterns are formed on the dielectric sheet of FIG. 3, FIG. 5 is a plan view showing a state where an earth electrode pattern is formed on the dielectric sheet of FIG. 3, FIG. 6 and FIG. 7 are views when the dielectric sheets are laminated, wherein FIG. 6 is a front view and FIG. 7 is a side view, FIG. 8 is a front view when a laminate is pressed, FIG. 9 is a front view when external electrodes are formed, FIG. 10 is an equivalent circuit diagram of the band-pass filter and FIG. 11 is a graph showing frequency characteristics of the band-pass filter.

As shown in FIG. 2, the band-pass filter of the present invention comprises, a dielectric layer 1 including plural dielectric sheets 101 ... and protective layers 2, 3 provided on upper and lower sides of the dielectric layer 1. On one surface 101a of the top dielectric sheet 101, two coil electrode patterns (first electrodes) 41 and 42 are formed. These are fired and integrated with one another.

A specific construction of the coil electrode pattern 41 is such that, pattern pieces 41a and 41b which are linear and disposed on the opposite sides of the pattern are connected via a linear pattern piece 41c which is connected a respective end of each of the pattern pieces 41a, 41b, and on the other end of the pattern piece 41b is formed a pattern piece 41d which is extended toward the pattern piece 41a so as to be parallel to the pattern piece 41c (that is, a loop shape).

The coil electrode pattern 41 is so constructed that a total length $L_3$ of the coil electrode pattern 41 becomes the length shown in Equation 3.

Equation 3

$$L_3 \approx \frac{1}{4} \lambda \times \frac{1}{\sqrt{\epsilon}}$$

Where, $\lambda$; wavelength, $\epsilon$; dielectric constant.

It is desirable that a distance $L_1$ between the pattern piece 41d and the pattern piece 41a (refer to FIG. 1) is equal to or less than a width $L_2$ of the pattern piece 41a (width of pattern piece 41b, pattern piece 41c and pattern piece 41d is also same as width $L_2$). In the following examples, a distance between the pattern pieces 41a and 41d is called a gap 30.

To the coil electrode pattern 41, an earth terminal pattern 6a and an input/output terminal pattern 7a are connected, and end portions of the earth terminal pattern 6a and input/output terminal pattern 7a are extended to a side face A of the band-pass filter.

Meanwhile, the coil electrode pattern 42 has substantially the same shape as the coil electrode pattern 41 having the aforesaid construction as shown in FIG. 1. However, they are different in that, a gap 31 is formed between the pattern pieces 42b and 42c, and that end portions of the earth terminal pattern 6b and the input/output terminal pattern 7b are extended to a side face B (opposite from the side face A) of the band-pass filter.

The pattern pieces 41d, 42c of the coil electrode patterns 41, 42 are disposed in an adjoining fashion with each other, and are connected magnetically.

An earth electrode pattern (second electrode) 5 is formed on a face 3a of the protective layer 3 on the side of the dielectric layer 1, and is constituted substantially throughout the face 3a such that the size of the earth electrode pattern 5 becomes larger than a periphery of the coil electrode patterns 41 and 42. Also, at positions on the face 3a corresponding to the earth terminal patterns 6a and 6b, earth terminal patterns (other earth terminals) 8a and 8b whose one ends are connected to the earth electrode pattern 5 and the other ends are extended to the side face A or the side face B of the band-pass filter are formed. And, the earth terminal pattern 6a and the earth terminal pattern 8a are connected to an external earth electrode 9a, the earth terminal pattern 6b and the earth terminal pattern 8b are connected to an external earth electrode 9b, the input/output terminal pattern 7a is connected to an external input/output electrode 10a, and the input/output terminal pattern 7b is connected to an external input/output electrode 10b. The external earth electrodes 9a, 9b and the external input/output electrodes 10a, 10b have a U-shaped cross section and are formed on the side faces of the band-pass filter.

Hereupon, the band-pass filter having the above-mentioned construction was produced by the following procedures.

First, on one surface of a dielectric sheet 101 (about several tens of μm thick) shown in FIG. 3, copper paste or the like is coated to form patterns (the same patterns as the coil electrode patterns 41, 42 and the terminal patterns 6a, 6b, 7a, 7b) 12 as shown in FIG. 4. While, in parallel thereto, on one surface of a protective sheet 11 having same configuration as the dielectric sheet 101 (however, its thickness may be different), copper paste or the like is coated to form a pattern (same pattern as the earth electrode pattern 5 and the earth terminal patterns 8a, 8b) 13 as shown in FIG. 5.

Next, as shown in FIG. 6 and FIG. 7, a protective sheet 2, a sheet layer 16 and the protective sheet 11 (having the same construction as the protective sheet 2) are laminated in order, such that the pattern 12 and the pattern 13 are disposed on the opposite sides via the sheet layer 16 consisting of the dielectric sheets 101, and further, are pressed to produce a laminate 15. Hereinafter, at locations (the locations which serve as the external earth electrodes 9a, 9b and the external input/output electrodes 10a, 10b) corresponding to exposed portions 17a, 17b, 18a, 18b, 19a, 19b of paste layers shown in FIG. 8, the copper paste or the like is printed or coated to produce paste layers 20a, 20b, 21a and 21b as shown in FIG. 9. Then, the dielectric sheets are integrated by firing the laminate, whereby the band-pass filter is produced. The laminate may also be fired by a process separate from firing the paste layers 20a, 20b, 21a and 21b.

Now, though no capacitor pattern is formed on the band-pass filter which is produced in the above-mentioned manner, it has an equivalent circuit as shown in FIG. 10 (in the figure, reference character M designates a magnetic connection). This is due to two reasons shown in the following.

[1] The coil electrode patterns 41, 42 and the earth electrode pattern 5 are at the same potential (that is, in the earthed state).

[2] Since the dielectric layer 1 is interposed between the coil electrode patterns 41, 42 and the earth electrode pattern 5, a floating capacitance is produced.

Since the capacitance is formed in such a manner and since the pattern pieces 41d, 42c of the coil electrode patterns 41, 42 are magnetically connected, the filter has the equivalent circuit as shown in FIG. 10.

Since the above-mentioned floating capacitance is mainly produced between the coil electrode patterns 41, 42 and the earth electrode pattern 5, by bringing the coil electrode patterns 41, 42 and the earth electrode pattern 5 toward or away from one another, a capacitance of the capacitor changes and it is possible to change the frequency of a passing band. Specifically, when the coil electrode patterns 41, 42 and the earth electrode pattern 5 are brought close to one another (reducing the number of the dielectric sheets 101), since the capacitance of the capacitor increases, the passing band frequency becomes lower, while when the coil electrode patterns 41, 42 and the earth electrode pattern 5 are moved apart from one another (increasing the number of the dielectric sheets 101), since the capacitance of the capacitor decreases, the passing band frequency becomes higher. The floating capacitance can also be changed in response to the dielectric constant of the dielectric layer 1 or the size of the coil electrode patterns 41, 42. For example, when a width $L_2$ of the coil electrode patterns 41, 42 is broadened, the filter size can be minimized because the floating capacitance becomes larger and the passing band frequency can be lowered. However, when distances between the pattern pieces 41a and 41b, pattern pieces 41c and 41d, pattern pieces 42a and 42b and pattern pieces 42c and 42d are too narrow, the waveform is deteriorated, so it is not desirable to unnecessarily broaden the width $L_2$ of the coil electrode patterns 41, 42.

Furthermore, a band width of the above-mentioned band-pass filter is changed by changing a distance $L_6$ between the pattern pieces 41d and 42c. Specifically, when the distance $L_6$ is narrowed, the band width becomes wider, while when the distance $L_6$ is broadened, the band width becomes narrower. However, it is not desirable to unnecessarily narrow the distance $L_6$ as it shows a double-humped characteristic.

Input/output impedances are changed by changing a distance $L_9$ between the earth terminal pattern 6a and the input/output terminal pattern 7a, or a distance $L_8$ between the earth terminal pattern 6b and the input/output terminal pattern 7b.

According to the experiment, by adjusting a dielectric constant or thickness of the dielectric layer 1 or an area of the coil electrode pattern 4, applicable frequencies of the band-pass filter of the present invention could be set in the range of several hundred MHz to several GHz. An example thereof is shown in the following experiment.

[Experiment]

Frequency characteristics of the band-pass filter having the above-mentioned construction were examined, and the result is shown in FIG. 11.

[Other Respects]

[1] The band-pass filter of the present example can be installed and soldered by positioning electrodes on a printed circuit board and the external earth electrodes 9a, 9b and the external input/output electrodes 10a, 10b next to one another. At this time, since the filter exterior is covered with the protective layers 2, 3, the coil electrode patterns 41, 42 and the earth electrode pattern 5 are protected from damage.

[2] The dielectric layer 1 is not limited to the construction where several thin dielectric sheets 101 are laminated, but rather a dielectric sheet which is formed into a predetermined thickness beforehand may be used.

[3] The band-pass filter of the present invention need not be produced one by one, but may be produced by forming plural coil electrode patterns 41, 42 on a broad dielectric sheet, and forming the same number of earth electrode patterns 5 on a similar dielectric sheet, and after laminating in that state, cutting the laminate apart one by one for firing.

(Second Example)

A second example of the present invention is described in the following with reference to FIG. 12 and FIG. 13. FIG. 12 is a plan view of essential portions of a band-pass filter according to the second example of the present invention, and FIG. 13 is a graph showing frequency characteristics of the band-pass filter shown in FIG. 12. Parts having the same function as the first example are designated by the same reference numerals and their descriptions are omitted. This applies also to the following examples.

As shown in FIG. 12, it has the same configuration as the first example, except end portions of the pattern pieces 41d, 42c are respectively connected to end portions of the pattern pieces 41a, 42b (that is, gaps 30, 31 are not formed).

(Experiment)

Frequency characteristics of the band-pass filter having the above-mentioned construction were examined, and the result is shown in FIG. 13.

(Third Example)

A third example of the present invention is described in the following with reference to FIG. 14 and FIG. 15. FIG. 14 is a plan view of essential portions of a band-pass filter according to the third example of the present invention, and FIG. 15 is a graph showing frequency characteristics of the band-pass filter shown in FIG. 14.

As shown-in FIG. 14, it has the same configuration as the first example, except that a gap 30 of the coil electrode pattern 41 is formed between the pattern piece 41a and pattern piece 41c.

(Experiment)

Figure 15:
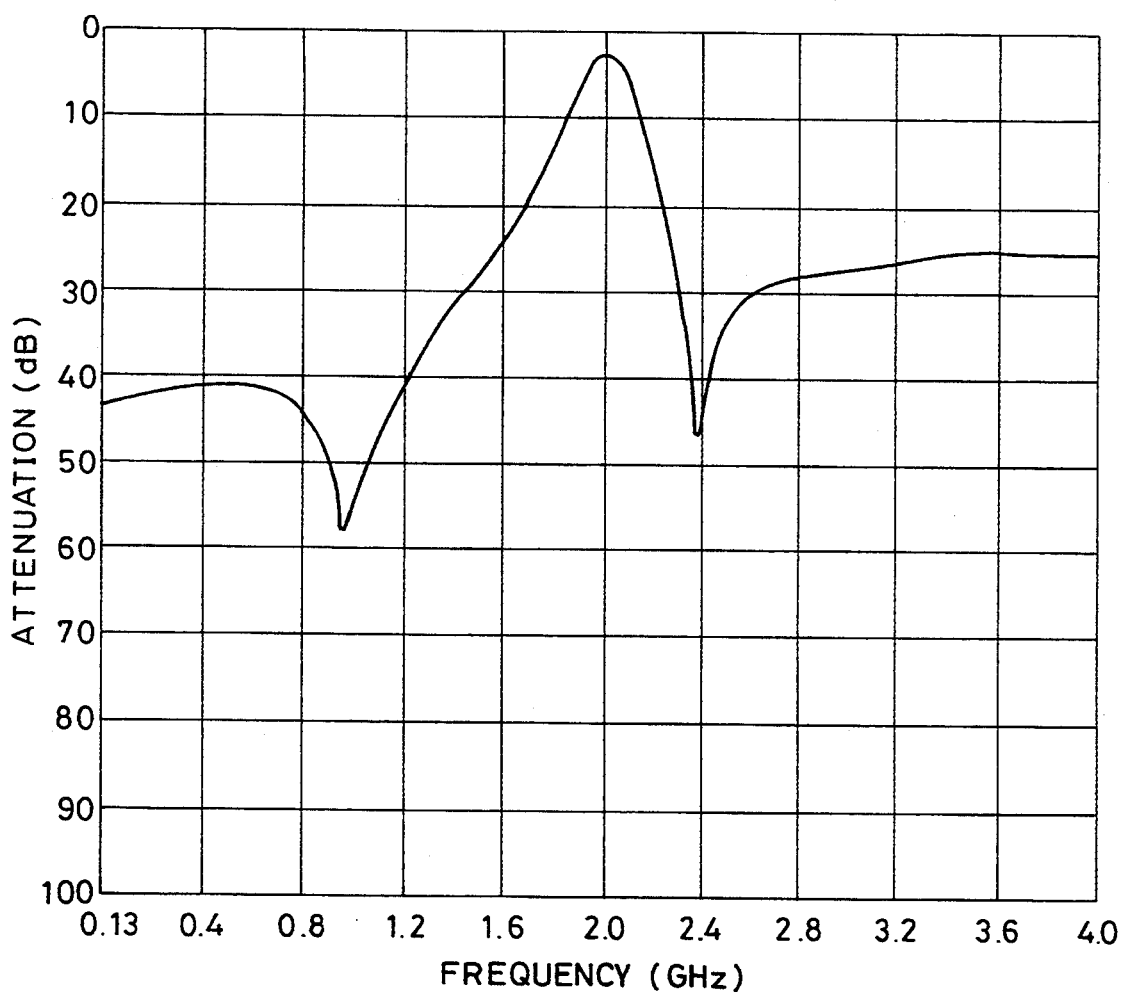
FIG. 15 is a graph showing frequency characteristics of the band-pass filter shown in FIG. 14.

Frequency characteristics of the band-pass filter having the above-mentioned construction were examined, and the result is shown in FIG. 15.

(Fourth Example)

A fourth example of the present invention is described in the following with reference to FIG. 16 and FIG. 17. FIG. 16 is a plan view of essential portions of a band-pass filter according to the fourth example of the present invention, and FIG. 17 is a graph showing frequency characteristics of the band-pass filter shown in FIG. 16.

As shown in FIG. 16, it has the same configuration as the first example, except that the gap 30 of the coil electrode pattern 41 is formed between the pattern piece 41a and the pattern piece 41c, and a gap 31 of the coil electrode pattern 42 is formed between the pattern piece 42b and pattern piece 42d.

(Experiment)

Frequency characteristics of the band-pass filter having the above-mentioned construction were examined, and the result is shown in FIG. 17.

(Fifth Example)

Figure 18:
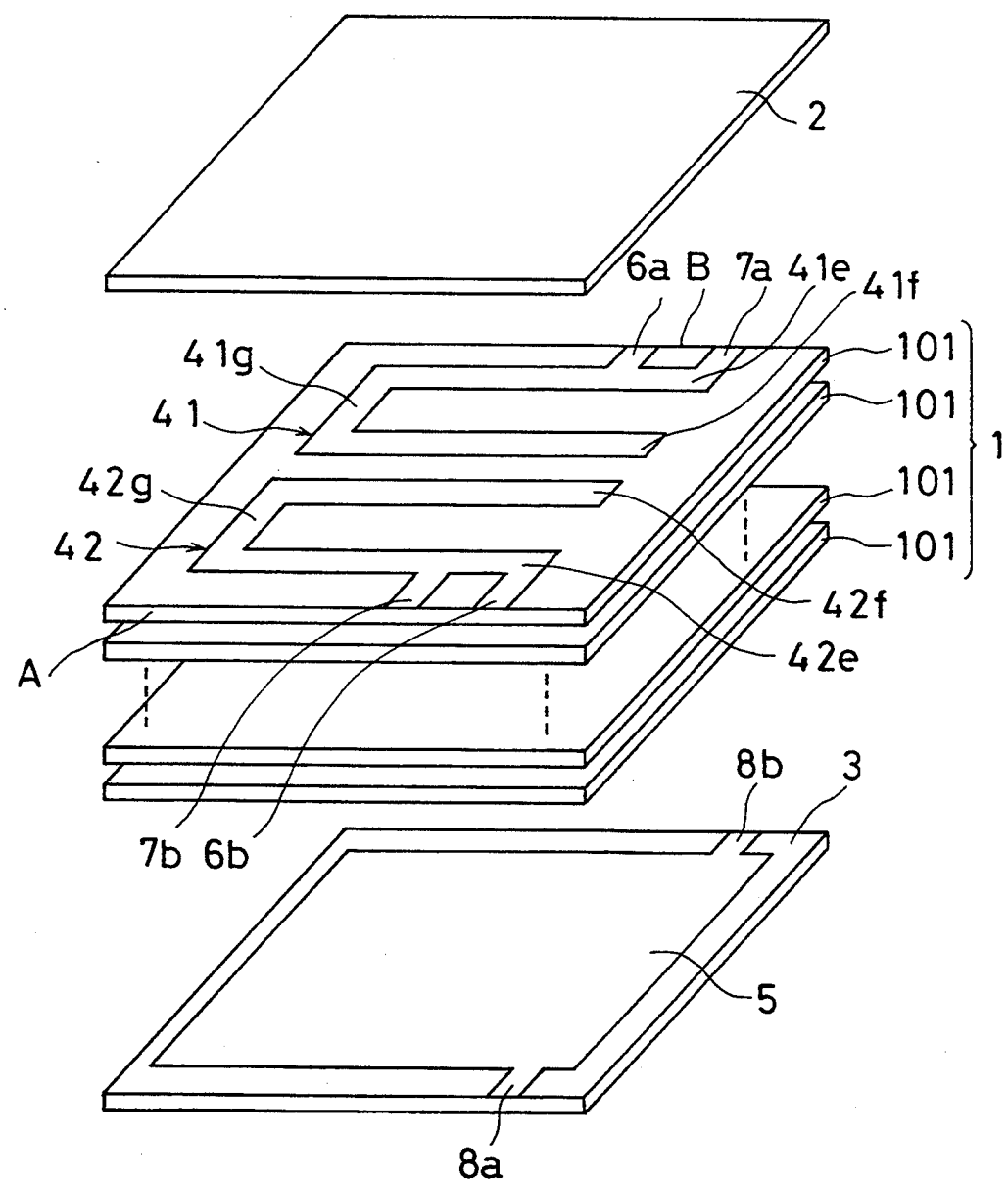
FIG. 18 is an exploded perspective view of a band-pass filter according to a fifth example of the present invention.

A fifth example of the present invention is described in the following with reference to FIG. 18 through FIG. 20. FIG. 18 and FIG. 19 are views showing a band-pass filter according to the fifth example of the present invention, wherein FIG. 18 is an exploded perspective view and FIG. 19 is a plan view of essential portions, FIG. 20 is a graph showing frequency characteristics of the band-pass filter shown in FIG. 18 and FIG. 19.

As shown in FIG. 18 and FIG. 19, it has the same configuration as the first example, except that the shapes of the coil electrode patterns 41, 42 are made different. Specifically, linear pattern pieces 41e, 41f and pattern pieces 42e, 42f disposed oppositely in a lateral direction are respectively connected, via linear pattern pieces 41g and 42g which are connected to respective ends of the pattern pieces 41e, 41f and the pattern pieces 42e, 42f. And it is constructed such that, to one end of the pattern piece 41e, the earth terminal pattern 6a and the input/output terminal pattern 7a are connected and extended to an end face B, and to one end of the pattern piece 42e, the earth terminal pattern 6b and the input-/output terminal pattern 7b are connected and extended to an end face A.

(Experiment)

Figure 20:
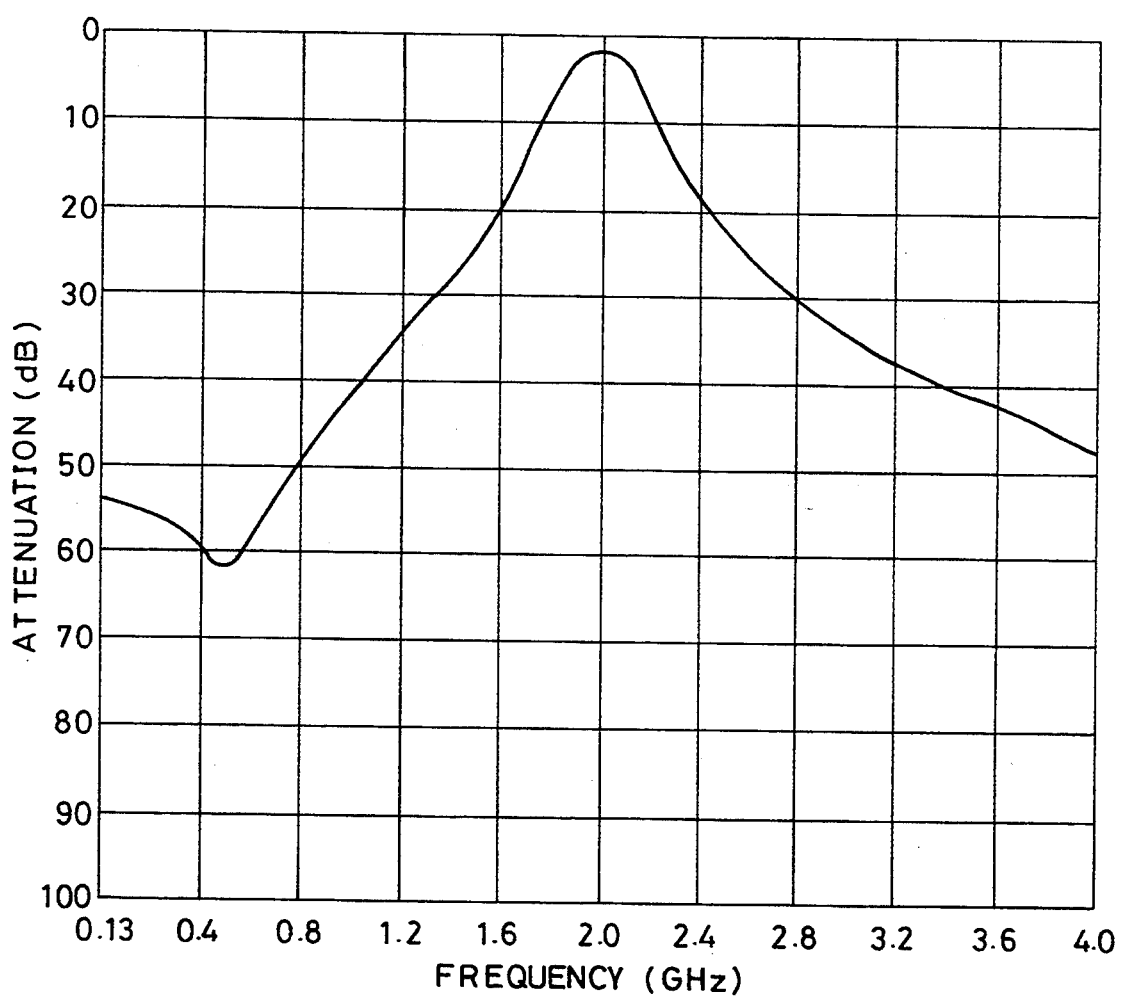
FIG. 20 is a graph showing frequency characteristics of the band-pass filter shown in FIG. 18 and FIG. 19.

Frequency characteristics of the band-pass filter having the above-mentioned construction were examined, and the result is shown in FIG. 20.

(Sixth Example)

Figure 25:
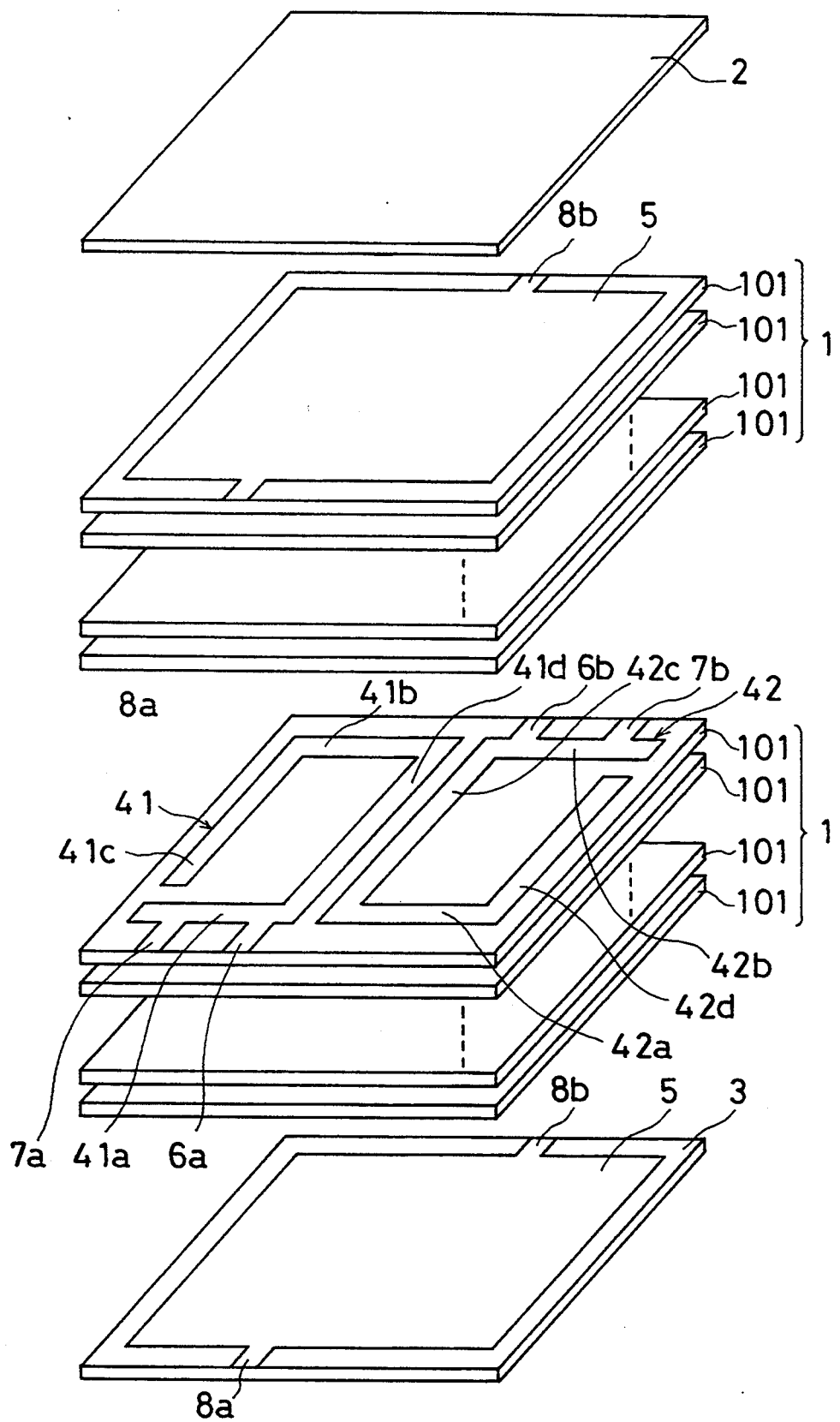
FIG. 25 is an exploded perspective view of a band-pass filter according to another modified example of the sixth example.

A sixth example of the present invention is described in the following with reference to FIG. 21 through FIG. 26. FIG. 21, FIG. 23, FIG. 25 are exploded perspective views of a band-pass filter according to the sixth example of the present invention, and FIG. 22, FIG. 24 and FIG. 26 are graphs respectively showing frequency characteristics of the band-pass filters shown in FIG. 21, FIG. 23 and FIG. 25.

As shown in FIG. 21, FIG. 23 and FIG. 25, they respectively have the same construction as the first example, the third example and the fourth example, except that the dielectric layer 1 and the earth electrode pattern 5 are disposed in order not only on one side but rather on both sides of the coil electrode patterns 41, 42.

(Experiment)

Figure 22:
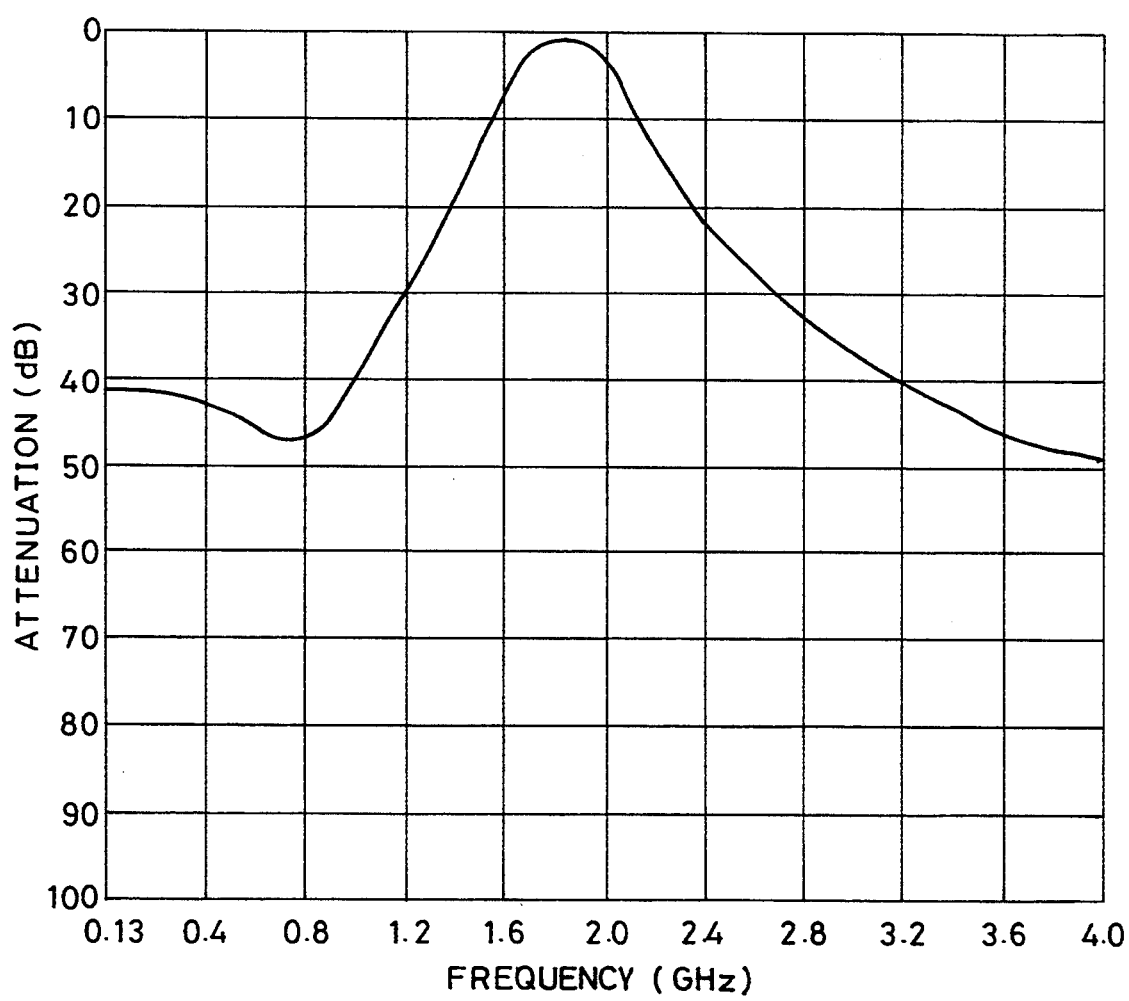
FIG. 22 is a graph showing frequency characteristics of the band-pass filter shown in FIG. 21.
Figure 23:
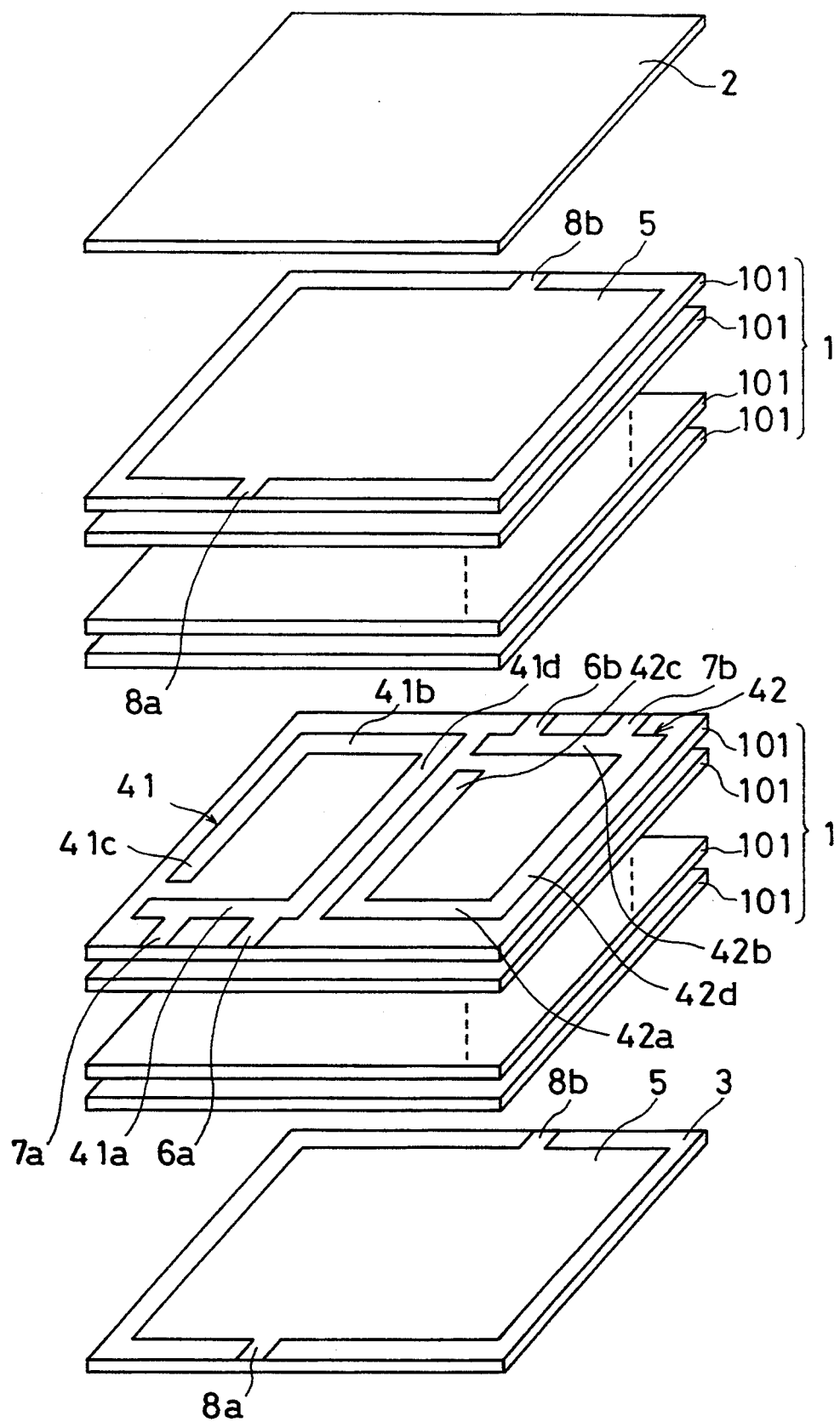
FIG. 23 is an exploded perspective view of a band-pass filter according to a modified example of the sixth example.

Frequency characteristics of the band-pass filters having the above-mentioned construction were examined, and the results are shown in FIG. 22, FIG. 24 and FIG. 26.

As shown in FIG. 22, FIG. 24 and FIG. 26, the above-mentioned band-pass filters have somewhat low passing band frequencies.

This is believed to be due to an increase in the capacitance of a capacitor of the band-pass filter, because a floating capacitance is formed not only on one side but on both sides of the coil electrode patterns 41, 42.

Although not shown in the above-mentioned example, it has been confirmed by the experiment that the same effect as previously stated is obtained even when the band-pass filters shown in the second example and fifth example are constructed similarly.

(Seventh Example)

Figure 27:
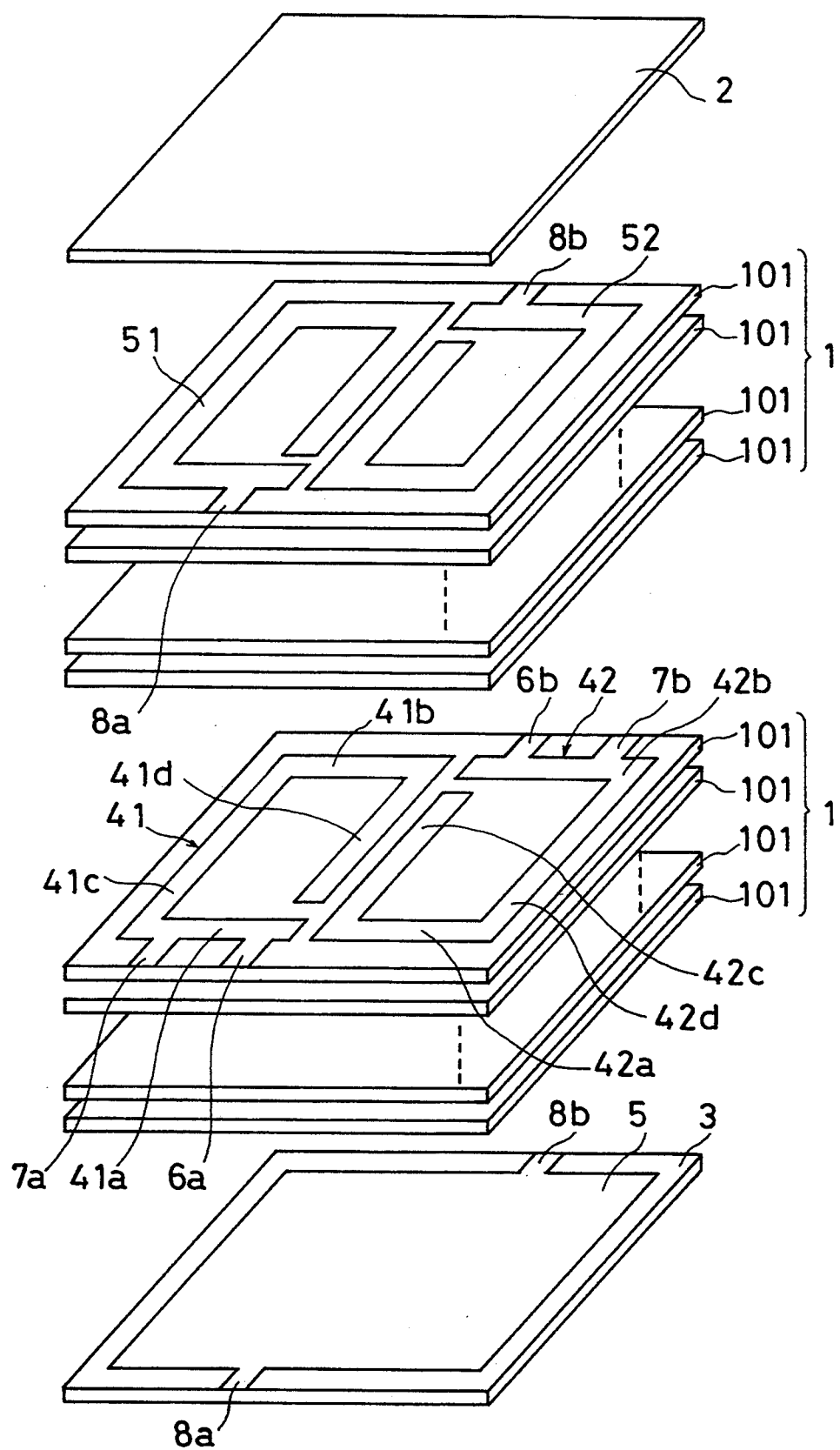
FIG. 27 is an exploded perspective view of a band-pass filter according to a seventh example of the present invention.
Figure 28:
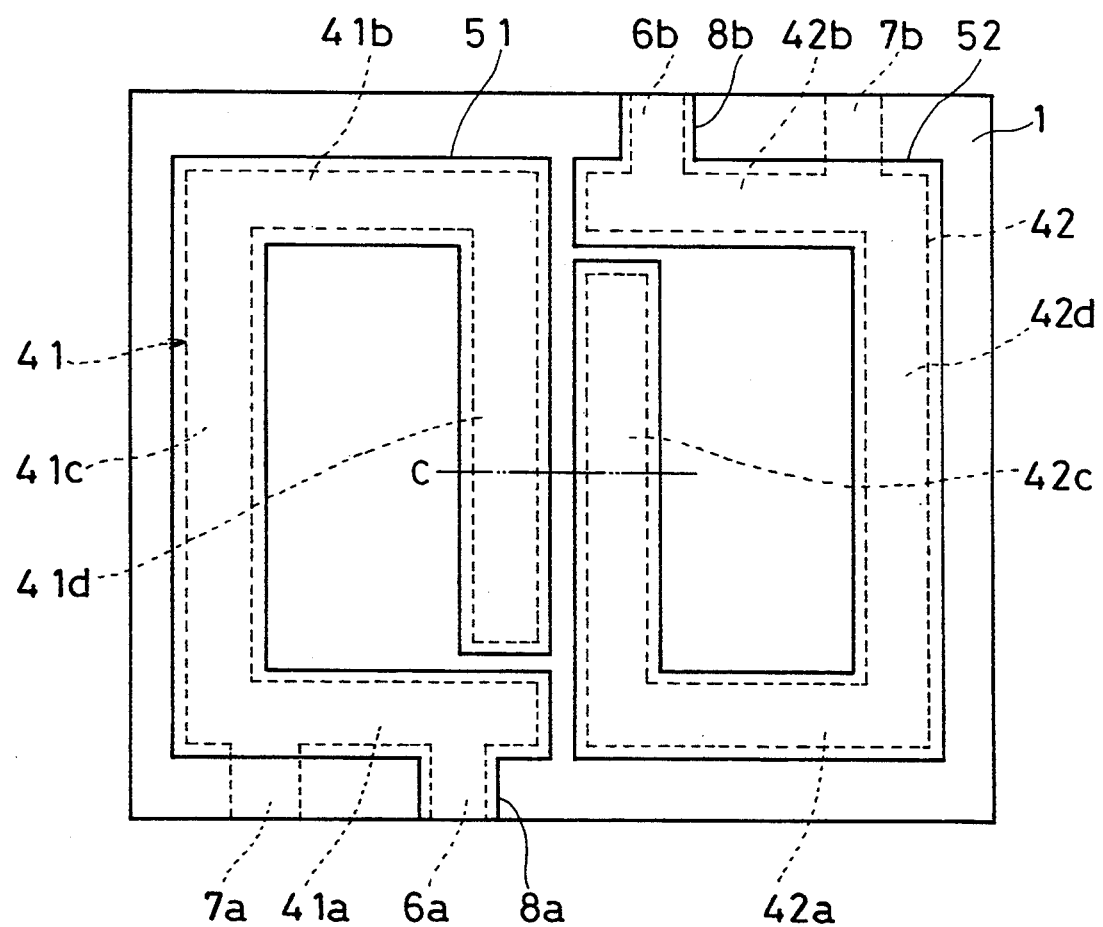
FIG. 28 is a plan view of essential portions of the band-pass filter according to a seventh example of the present invention.

A seventh example of the present invention is described in the following with reference to FIG. 27 and FIG. 28. FIG. 27 and FIG. 28 are views showing a band-pass filter according to the seventh example of the present invention, wherein FIG. 27 is an exploded perspective view and FIG. 28 is a plan view of essential portions.

As shown in FIG. 27 and FIG. 28, it has the same configuration as the band-pass filter shown in FIG. 21 of the sixth example, except that the shape of one earth electrode pattern (an upper pattern in FIG. 27) is made different. Specifically, it is so constructed that the earth electrode pattern 5 is divided into two sections comprising respective patterns 51, 52 which are formed with the same shape but with a larger size than the coil electrode patterns 41, 42, and the earth terminal patterns 8a, 8b are respectively connected to the earth electrode patterns 51, 52.

By such a configuration, it is possible to simply adjust the frequency, because the floating capacitance can be adjusted just by cutting a portion (e.g. the portion shown by two-dot chain line C in FIG. 28) of the earth electrode patterns 51, 52 corresponding to the pattern pieces 41d, 42c.

Though the above-mentioned adjustment is also possible for the earth electrode patterns of the first example to the fifth example (formed across almost the entire dielectric sheet), when the frequency is to be adjusted, the configuration of this example is preferable, because the cut length needed for the earth electrode patterns of the first example to the fifth example are long.

Moreover, the earth electrode pattern of this example is not limited to the band-pass filter having the construction shown in FIG. 21 of the sixth example, but is also applicable for those shown in the other examples.

(Eighth Example)

Figure 29:
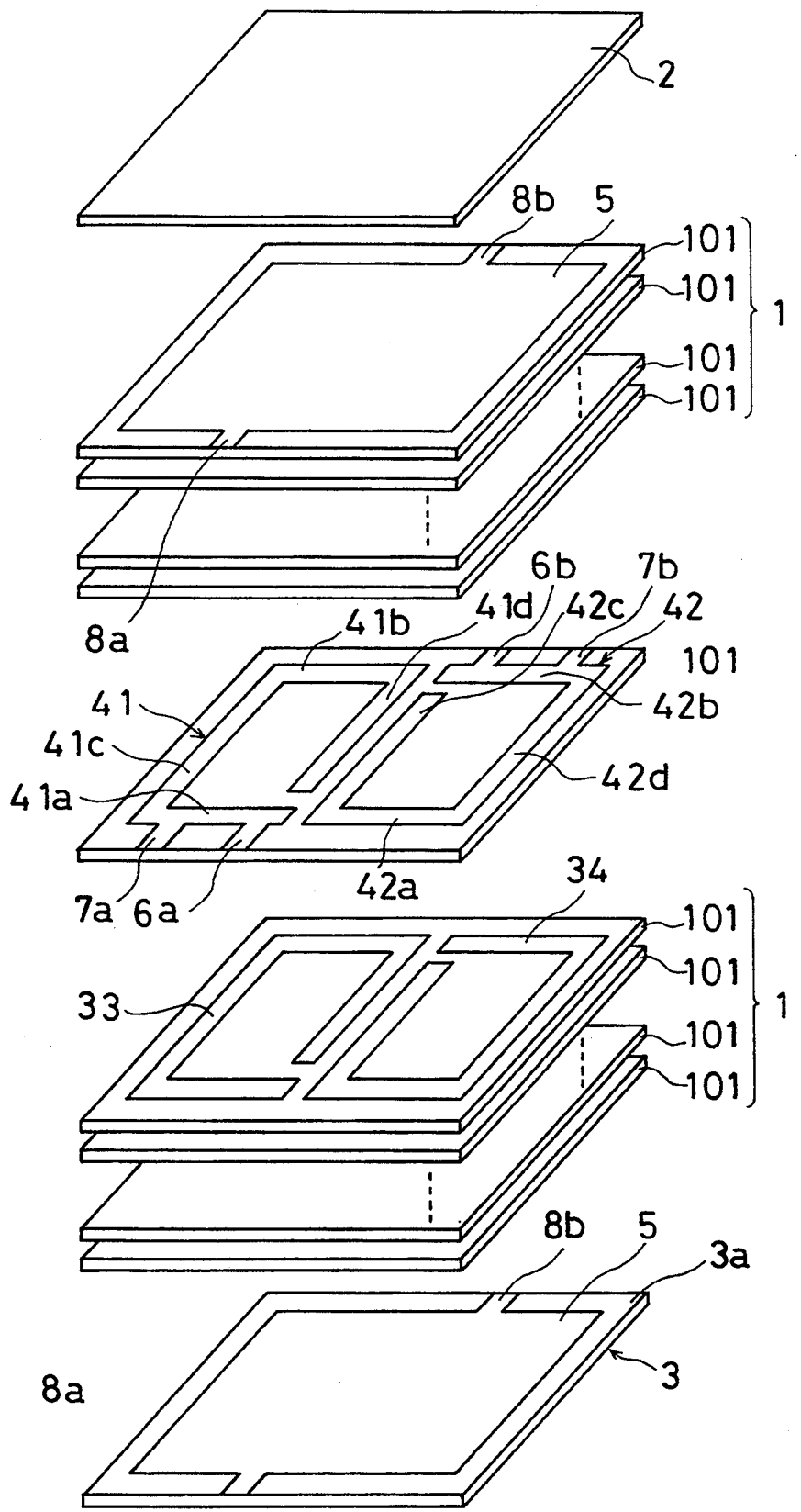
FIG. 29 is an exploded perspective view of a band-pass filter according to an eighth example of the present invention.

An eighth example of the present invention is described in the following with reference to FIG. 29. FIG. 29 is an exploded perspective view of a band-pass filter according to the eighth example of the present invention.

As shown in FIG. 29, it has the same configuration as the band-pass filter shown in FIG. 21 of the sixth example, except floating electrode patterns (third electrodes) 33, 34 having the same shape as the coil electrode patterns 41, 42 are formed on the dielectric sheet 101 adjacent to the dielectric sheet 101 whereon the coil electrode patterns 41, 42 are formed.

Although not shown, it has been confirmed by the experiment that by such a configuration the peak of the passing band frequency becomes much lower than in the band-pass filter shown in FIG. 21 of the sixth example.

This is believed to be due to an increase in the capacitance of the capacitor of the band-pass filter, because a floating capacitance is formed between the coil electrode patterns 41, 42 and the floating electrode patterns 33, 34.

Figure 39:
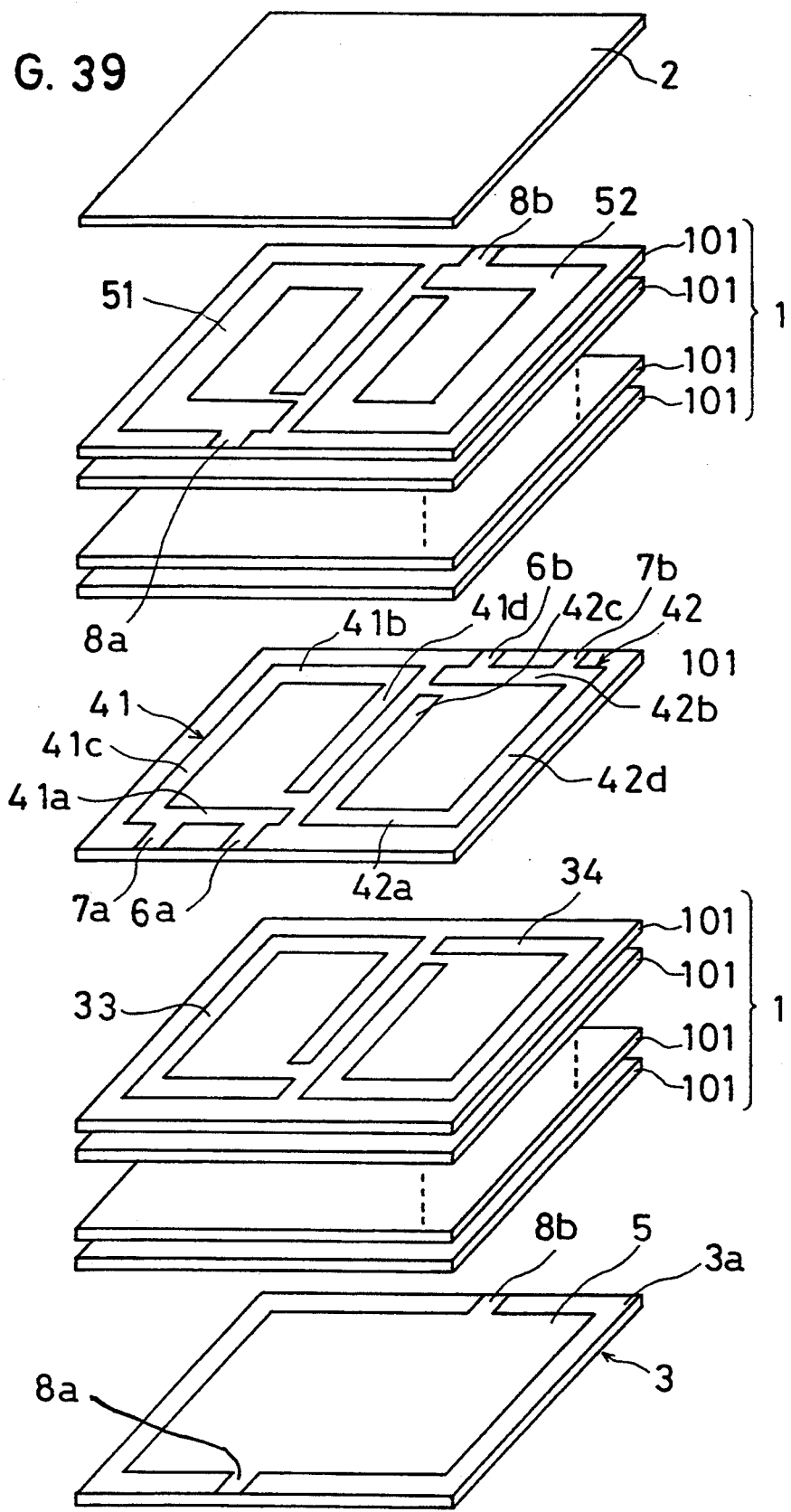
FIG. 39 is an exploded perspective view of a band-pass filter according to an additional example of the present invention.

FIG. 39 shows a modification of the eighth example (FIG. 29), in which the earth electrode pattern 5 has been replaced by a pair of earth electrode patterns 51 and 52 which are formed with the same shape as the coil electrode patterns 41, 42 but with a larger strip size. As in the eighth example, earth terminal patterns 8a, 8b are respectively connected to the earth electrode patterns 51, 52.

(Ninth Example)

Figure 30:
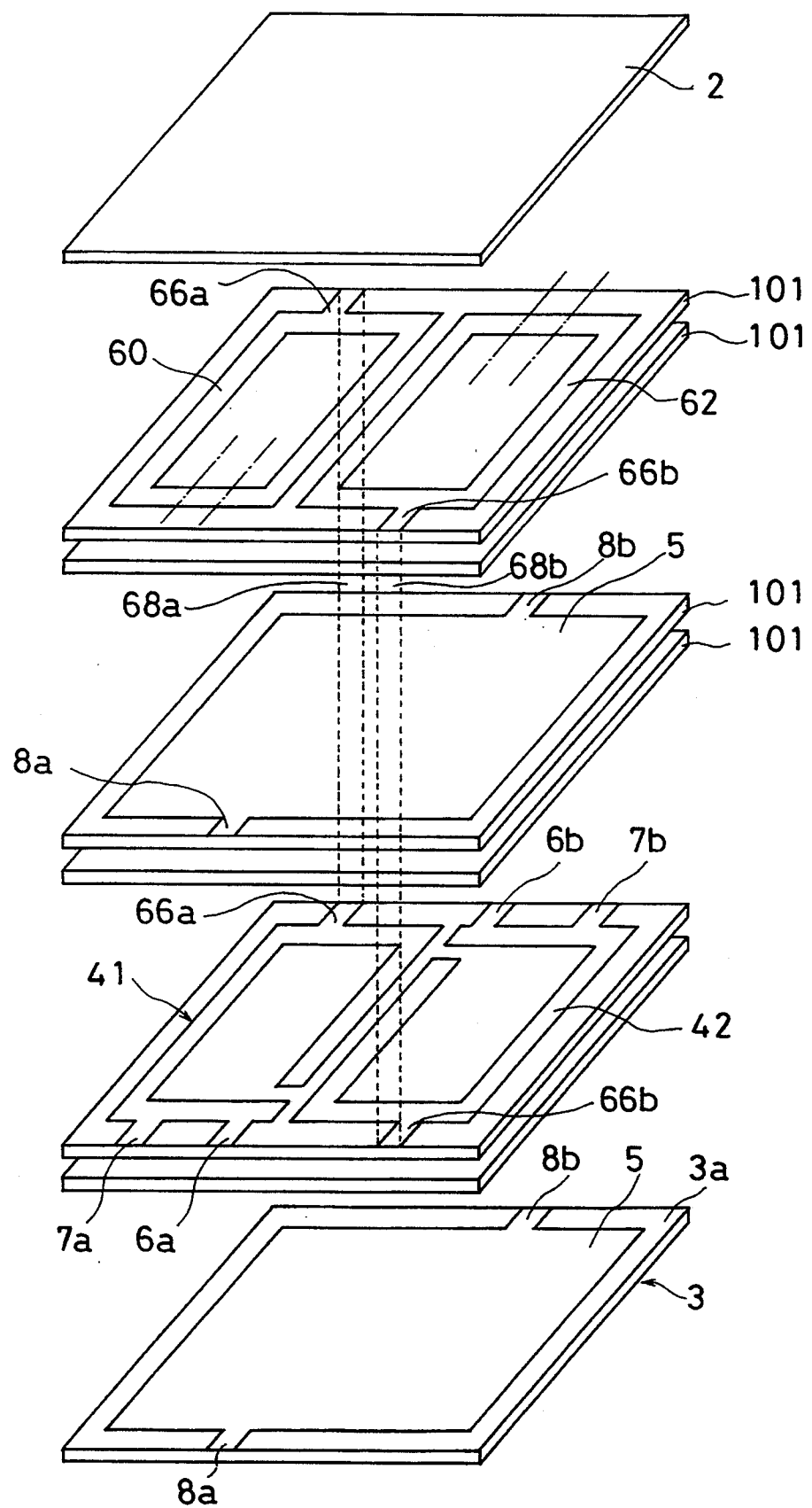
FIG. 30 is an exploded perspective view of a band-pass filter according to a ninth example of the present invention.

A ninth example of the present invention is described in the following with reference to FIG. 30. FIG. 30 is an exploded perspective view of a band-pass filter according to the ninth example of the present invention.

In the band-pass filter of the ninth example, loop shaped trimming electrodes 60, 62 are formed between one earth electrode pattern (an upper pattern in FIG. 30) and the protective layer 2. The trimming electrodes 60, 62 are disposed on the opposite side of the coil electrode patterns 41, 42 with the dielectric sheet 101 and the earth electrode pattern 5 between them. Connecting terminal patterns 66a, 66b are formed respectively to the trimming electrodes 60, 62, and connected to the connecting terminal patterns 66a, 66b drawn out from the coil electrode patterns 41, 42 toward the different sides of the dielectric sheet 101. The connecting terminal pattern 66a of the trimming electrode 60 is connected to the connecting terminal pattern 66a of the coil electrode pattern 41 via an external connecting electrode 68a. Similarly, the connecting terminal pattern 66b of the trimming electrode 62 is connected to the connecting terminal pattern 66b of the coil electrode pattern 42 via an external connecting electrode 68b.

In the band-pass filter of the ninth example, the floating capacitance between the trimming electrodes 60, 62 and the earth electrode pattern 5 is changed by trimming the trimming electrodes 60, 62 as shown by one-dot chain line in FIG. 30, for example with a laser trimming method. This changes the passing band frequency of the band-pass filter is changed.

Figure 31:
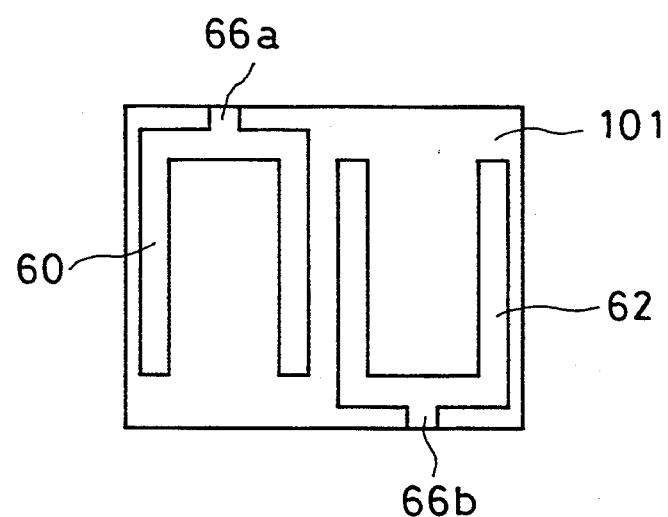
FIG. 31 is a plan view showing a modified example of the band-pass filter of FIG. 30.

The shape of the trimming electrodes 60, 62 is not limited to the loop shape, but may be a partial loop shape as shown in FIG. 31. In the case of using such shape, the floating capacitance is changed by trimming, which changes the passing band frequency of the band-pass filter as well.

(Tenth Example)

Figure 32:
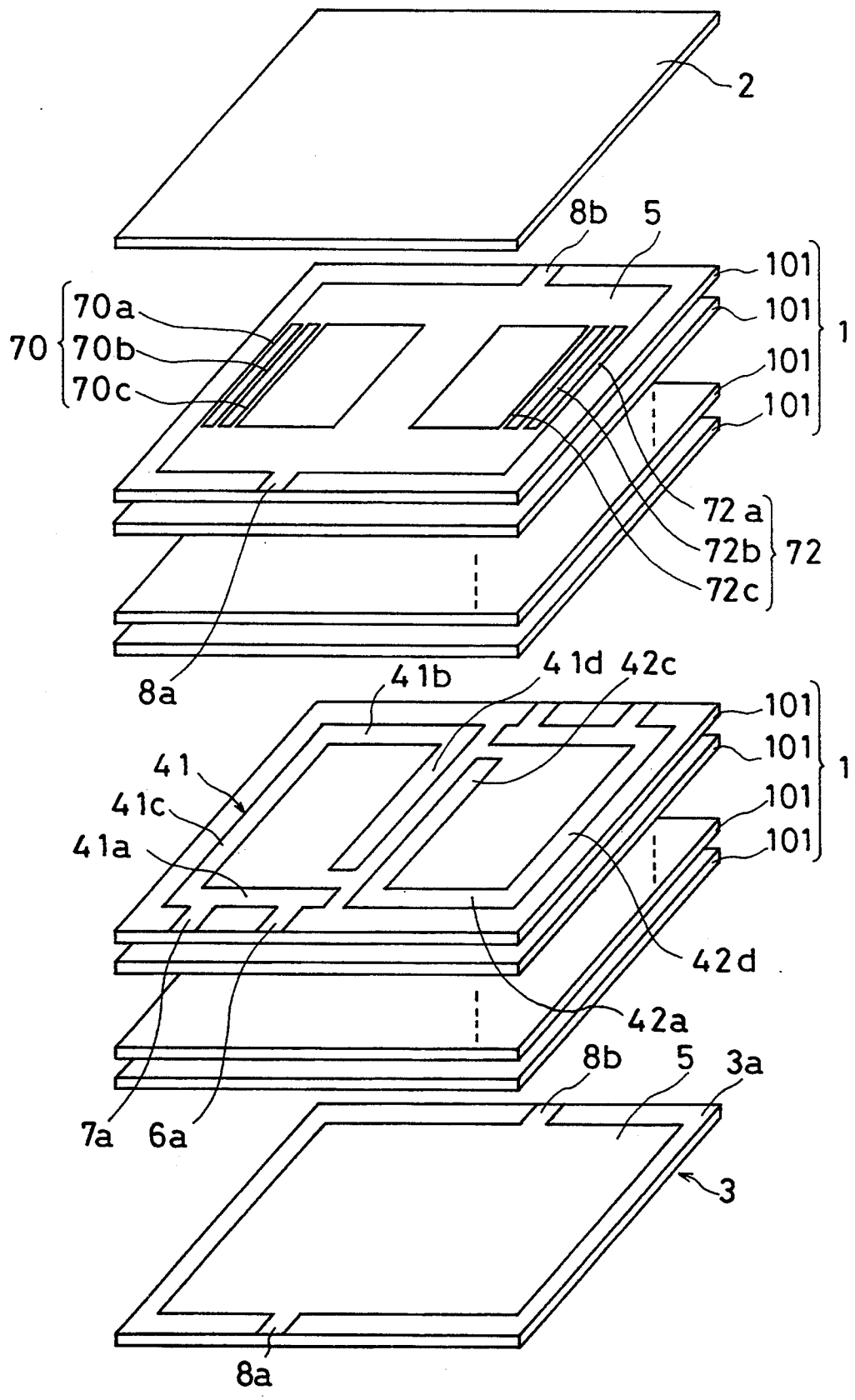
FIG. 32 is an exploded perspective view of a band-pass filter according to a tenth example of the present invention.

A tenth example of the present invention is described in the following with reference of FIG. 32. FIG. 32 is an exploded perspective view of a band-pass filter according to the tenth example of the present invention.

In the band-pass filter of the tenth example, trimming electrode groups 70, 72 are formed within one earth electrode pattern (an upper pattern in FIG. 32). The trimming electrode group 70 includes band or strip shaped trimming electrodes 70a, 70b, 70c. The trimming electrodes 70a, 70b, 70c are connected to the earth electrode pattern 5. Similarly, the trimming electrode group 72 includes plural trimming electrodes 72a, 72b, 72c.

Figure 33:
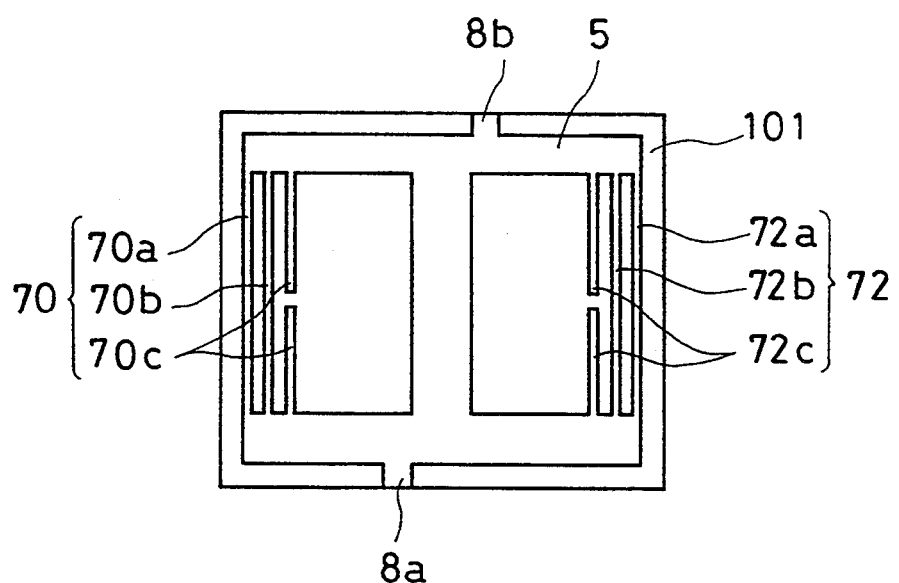
FIG. 33 is a plan view showing a state of cutting trimming electrodes of the band-pass filter of FIG. 32.

In the band-pass filter of the tenth example, the magnetic field shield effect becomes lower by cutting the trimming electrodes as shown in FIG. 33, for example with a laser trimming method. This matter equals to the growth of the magnetic field of each resonator, and the passing band frequency of the band-pass filter is changed. In this case, the changing rate of the passing band frequency can be adjusted by changing the cutting number of the trimming electrodes.

(Other Respects)

Figure 34:
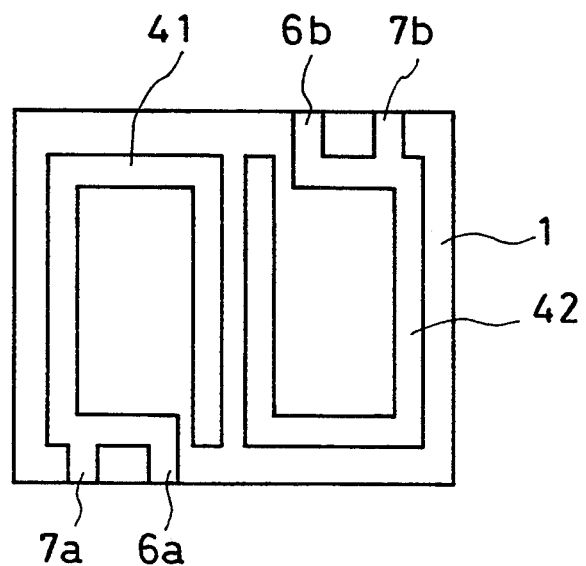
FIG. 34 is a plan view of essential portions showing a modified example of a band-pass filter of the present invention.
Figure 35:
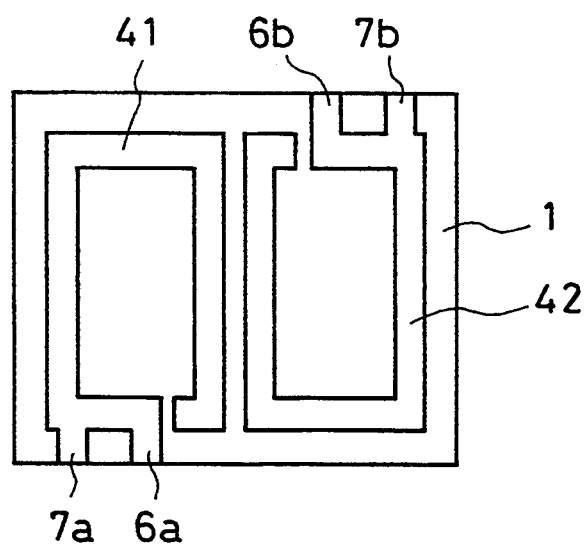
FIG. 35 is a plan view of essential portions showing another modified example of a band-pass filter of the present invention.
Figure 36:
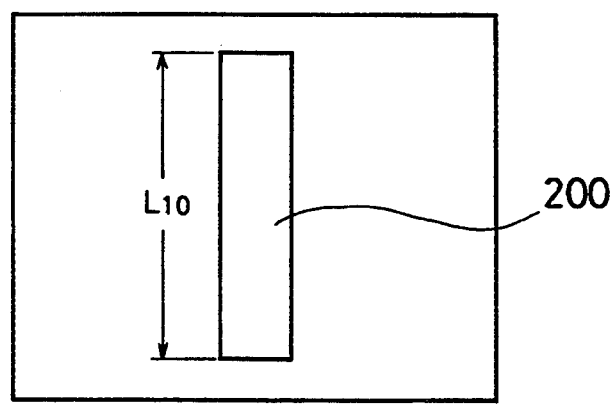
FIG. 36 is an explanatory view showing an example of a conventional strip-line type dielectric resonator.
Figure 37:
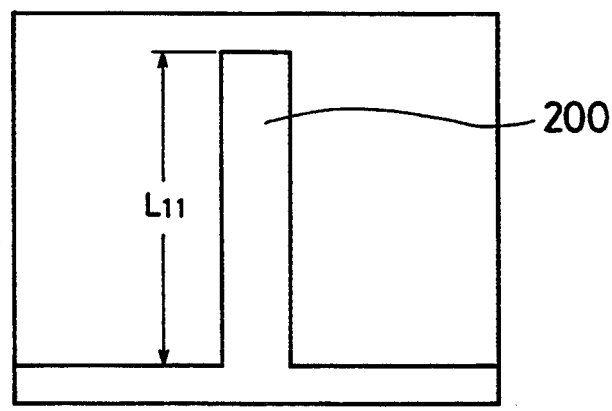
FIG. 37 is an explanatory view showing another example of a conventional strip-line type dielectric resonator.
Figure 38:
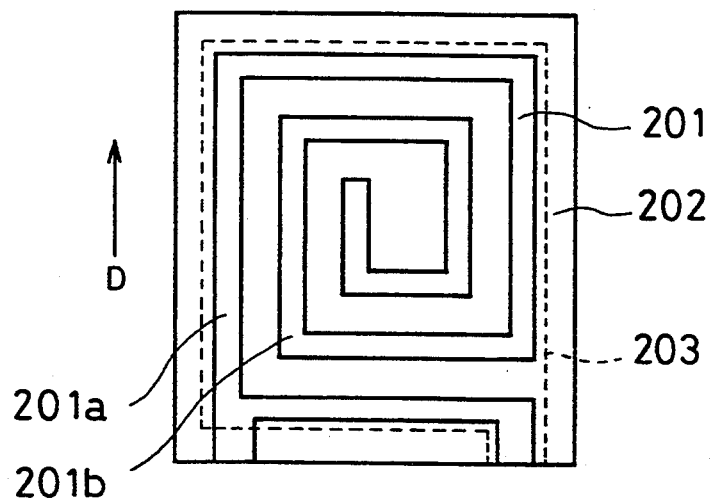
FIG. 38 is an explanatory view showing an example of a conventional coil-pattern type dielectric resonator.

The construction of the coil electrode patterns 41, 42 is not limited to those shown in the above-mentioned various examples. For example, it may be a loop shape as shown in FIG. 34 and FIG. 35.

As described heretofore, according to the present invention, because it has a so-called strip-line construction and because pattern pieces of the first electrodes are not adjacent to each other, it is possible to improve the Q remarkably. As a result, the insertion loss of the band-pass filter is reduced and the skirt characteristic is improved.

Moreover, since the first electrodes are looped, the size of the elements becomes smaller. In addition, it is very easy to adjust the impedance, because it can be adjusted just by changing a distance between the input-/output terminal and the earth terminal of the first electrodes.

Additionally, the passing band frequency of the pass-band filter can be adjusted by trimming the trimming electrodes which are formed within the earth electrode pattern or are connected to the coil electrode patterns. The predetermined passing band frequency can be obtained by adjusting the band-pass filter, if its passing band frequency is shifted from the predetermined value. Accordingly, the number of inferior devices can be reduced when the band-pass filter is produced.

In these respects, the invention has an effect of providing a very excellent small-sized band-pass filter whose insertion loss is small and whose input/output impedances and passing band frequency can be adjusted optionally.

It will be apparent from the foregoing that, while the present invention has been described in detail and illustrated, these are only particular illustrations and example and the invention is not limited to those. The spirit and scope of the invention is limited only by the appended claims.

What is claimed is:

1. A band-pass filter comprising:
   two first electrodes formed in a loop shape and disposed in a magnetically connecting state with each other;
   a second electrode formed in a plane shape opposite said first electrodes;
   a plate comprising a dielectric material, said plate having two opposed edges and being disposed between said first electrodes and said second electrode;
   two earth terminals drawn out respectively from said two first electrodes and extending toward respective opposed edges of said plate;
   two input/output terminals associated respectively with said two earth terminals and drawn out respectively from said two first electrodes and extending toward respective opposed edges of said plate, said earth terminals and input/output terminals being spaced apart by a selected distance so as to provide a predetermined impedance; and
   a pair of second earth terminals drawn out from said second electrode toward respective opposed edges of said plate.

2. A band-pass filter according to claim 1, wherein said input/output terminals and said earth terminals are directly conductively connected to external electrodes on said opposed edges of said plate.

3. A band-pass filter according to claim 2, wherein said two earth terminals from said first electrodes are directly conductively connected respectively to said pair of second earth terminals from said second electrode.

4. A band-pass filter according to claim 1, wherein said two earth terminals from said first electrodes are directly conductively connected respectively to said pair of second earth terminals from said second electrode.

5. A band-pass filter comprising:
two first electrodes formed in a loop shape and disposed in a magnetically connecting state with each other;
a pair of second electrodes each formed in a plane shape opposite said first electrodes on opposite sides thereof;
a pair of plates comprising a dielectric material, each said plate having two opposed edges and being disposed between said first electrodes and a respective one of said second electrodes;
two earth terminals drawn out respectively from said two first electrodes and extending toward respective opposed edges of said plate;
two input/output terminals associated respectively with said two earth terminals and drawn out respectively from said two first electrodes and extending toward respective opposed edges of said plate, said earth terminals and input/output terminals from said first electrodes being spaced apart by a selected distance so as to provide a predetermined impedance; and
each of said second electrodes having a pair of second earth terminals drawn out from said each second electrode toward respective opposed edges of said plate.

6. A band-pass filter according to claim 5, wherein at least one of said second electrodes is divided into two sections which respectively have a similar shape which is larger than said first electrodes, and said second earth terminals are drawn out respectively from two sections of said second electrodes.

7. A band-pass filter according to claim 5, wherein between said first electrodes and at least one of said second electrodes, third electrodes having substantially the same shape as said first electrodes are formed.

8. A band-pass filter according to claim 6, wherein between said first electrodes and said at least one of said second electrodes, third electrodes having substantially the same shape as said first electrodes are formed.

9. A band-pass filter according to claim 5, further comprising trimming electrodes which are formed in a loop shape and are formed opposite at least one of said second electrodes and spaced from said at least one of said second electrodes by a further plate comprising a dielectric material between said trimming electrodes and said at least one of said second electrodes, said trimming electrodes being connected respectively to said first electrode.

10. A band-pass filter according to claim 5, wherein at least one strip-shaped trimming electrode is formed within as least one of said second electrodes, and are connected to said at least one of said second electrodes.

11. A band-pass filter according to claim 9, wherein each of said trimming electrodes forms a closed loop shape.

12. A band-pass filter according to claim 9, wherein each of said trimming electrodes forms a partial loop shape.

13. A band-pass filter according to claim 10, wherein said at least one strip-shaped trimming electrode is defined by an elongated cutout formed within said at least one of said second electrodes.

14. A band-pass filter according to claim 10, wherein a plurality of said strip-shaped trimming electrodes are formed within said at least one of said second electrodes and are connected to said at least one of said second electrodes.

15. A band-pass filter comprising:
two first electrodes formed in a loop shape and disposed in a magnetically connecting state with each other;
a second electrode formed in a plane shape opposite said first electrodes;
a plate comprising a dielectric material, said plate having a periphery and being disposed between said first electrodes and said second electrode;
two earth terminals drawn out from said two first electrodes respectively and extending toward said periphery of said plate;
two input/output terminals associated respectively with said two earth terminals and drawn out from said two first electrodes and extending toward said periphery of said plate;
said earth terminals and input/output terminals being spaced apart by a selected distance around said periphery so as to provide a predetermined impedance; and
a pair of second earth terminals drawn out from said second electrode toward said periphery of said plate.

16. A band-pass filter comprising:
two first electrodes formed in a loop shape and disposed in a magnetically connecting state with each other;
a pair of second electrodes each formed in a plane shape opposite said first electrodes on opposite sides thereof;
a pair of plates comprising a dielectric material, each said plate having a periphery and being disposed between said first electrodes and a respective one of said second electrodes;
two earth terminals drawn out from said two first electrodes respectively and extending toward said periphery of said plate;
two input/output terminals associated respectively with said two earth terminals and drawn out respectively from said two first electrodes and extending toward said periphery of said plate;
said earth terminals and input/output terminals from said first electrodes being spaced apart around said periphery by a selected distance so as to provide a predetermined impedance; and
each of said second electrodes having a pair of second earth terminals drawn out from said each second electrode toward said periphery of said plate.

* * * * *